(12) United States Patent
Miller et al.

(10) Patent No.: US 8,330,556 B2
(45) Date of Patent: Dec. 11, 2012

(54) PASSIVATION LAYERS IN ACOUSTIC RESONATORS

(75) Inventors: Daniel J. Miller, San Francisco, CA (US); Martha Johnson, Fort Collins, CO (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 352 days.

(21) Appl. No.: 12/623,663

(22) Filed: Nov. 23, 2009

(65) Prior Publication Data

US 2011/0121915 A1   May 26, 2011

(51) Int. Cl.
 *H03H 9/15* (2006.01)
 *H03H 9/54* (2006.01)
 *H03H 3/02* (2006.01)

(52) U.S. Cl. ........ 333/187; 333/189; 310/324; 310/335; 29/25.35; 29/594; 204/192.23; 204/192.18; 427/100

(58) Field of Classification Search .......... 333/187–192; 310/322, 324, 334, 335; 29/25.35, 594; 204/192.18, 204/192.23; 427/100
See application file for complete search history.

(56) References Cited

U.S. PATENT DOCUMENTS

| | | | |
|---|---|---|---|
| 5,587,620 A | 12/1996 | Ruby et al. | |
| 5,872,493 A | 2/1999 | Ella | |
| 5,873,153 A | 2/1999 | Ruby | |
| 5,873,154 A | 2/1999 | Ylilammi et al. | |
| 5,910,756 A | 6/1999 | Ella | |
| 6,196,059 B1 * | 3/2001 | Kosslinger et al. | 73/61.49 |
| 6,262,637 B1 | 7/2001 | Bradley et al. | |
| 6,384,697 B1 | 5/2002 | Ruby | |
| 6,437,484 B1 * | 8/2002 | Nishimura et al. | 310/324 |
| 6,507,983 B1 | 1/2003 | Ruby et al. | |
| 6,542,054 B2 | 4/2003 | Aigner et al. | |
| 6,650,205 B2 | 11/2003 | Goetz et al. | |
| 6,828,713 B2 | 12/2004 | Bradley et al. | |
| 6,894,360 B2 * | 5/2005 | Bradley | 257/458 |
| 6,894,588 B2 | 5/2005 | Detlefsen | |
| 7,221,242 B2 * | 5/2007 | Asai et al. | 333/187 |
| 7,275,292 B2 | 10/2007 | Ruby et al. | |
| 7,345,409 B2 | 3/2008 | Leidl et al. | |
| 7,382,078 B2 * | 6/2008 | Bradley | 310/320 |
| 7,463,118 B2 * | 12/2008 | Jacobsen | 333/187 |
| 2006/0103492 A1 | 5/2006 | Feng et al. | |
| 2007/0040473 A1 | 2/2007 | Ballandras et al. | |
| 2007/0069606 A1 * | 3/2007 | Matsumoto et al. | 310/312 |
| 2007/0205850 A1 | 9/2007 | Jamneala et al. | |
| 2007/0228876 A1 * | 10/2007 | Sung | 310/320 |
| 2007/0266548 A1 | 11/2007 | Fattinger | |
| 2008/0258842 A1 | 10/2008 | Ruby et al. | |

OTHER PUBLICATIONS

R. Kazinczi, et al. "Reliability issues on MEMS Resonators", Delft University of Technology, DIMES; Faculty of Information Technology and Systems; Department of Electrical Engineering; Laboratory of Electronic Instrumentation, Mekelweg 4, 2628 CD Delft, the Netherlands.

* cited by examiner

*Primary Examiner* — Barbara Summons

(57) ABSTRACT

An acoustic resonator, comprises a substrate and a first passivation layer disposed over the substrate. The first passivation layer comprises a first layer of silicon carbide (SiC). The acoustic resonator further comprises a first electrode disposed over the passivation layer, a second electrode, and a piezoelectric layer disposed between the first and second electrodes. The acoustic resonator comprises a second passivation layer disposed over the second electrode. The second passivation layer comprises a second layer of silicon carbide (SiC).

16 Claims, 23 Drawing Sheets

PASSIVATION LAYERS IN ACOUSTIC RESONATORS

BACKGROUND

In many electronic applications, electrical resonators are used. For example, in many wireless communications devices, radio frequency (RF) and microwave frequency resonators are used as filters to improve reception and transmission of signals. Filters typically include inductors and capacitors, and more recently resonators.

As will be appreciated, it is desirable to reduce the size of components of electronic devices. Many known filter technologies present a barrier to overall system miniaturization. With the need to reduce component size, a class of resonators based on the piezoelectric effect has emerged. In piezoelectric-based resonators, acoustic resonant modes are generated in the piezoelectric material. These acoustic waves are converted into electrical waves for use in electrical applications.

One type of acoustic resonator is a Film Bulk Acoustic Resonator (FBAR). The FBAR has the advantage of small size and lends itself to Integrated Circuit (IC) manufacturing tools and techniques. The FBAR includes an acoustic stack comprising, inter alia, a layer of piezoelectric material disposed between two electrodes. Acoustic waves achieve resonance across the acoustic stack, with the resonant frequency of the waves being determined by the materials in the acoustic stack.

FBARs are similar in principle to bulk acoustic resonators such as quartz, but are scaled down to resonate at GHz frequencies. Because the FBARs have thicknesses on the order of microns and length and width dimensions of hundreds of microns, FBARs beneficially provide a comparatively compact alternative to known resonators.

FBARs may comprise a membrane (also referred to as the acoustic stack) disposed over air. Often, such a structure comprises the membrane suspended over a cavity provided in a substrate over which the membrane is suspended. Alternatively, FBARs comprise the membrane formed over an acoustic mirror formed in the substrate. Regardless of whether the membrane is formed over air or over an acoustic mirror, the membrane comprises a piezoelectric layer disposed over a first electrode, and a second electrode disposed over the piezoelectric layer.

Desirably, the FBAR excites only thickness-extensional (TE) modes, which are longitudinal mechanical waves having propagation (k) vectors in the direction of propagation. The TE modes desirably travel in the direction of the thickness (e.g., z-direction) of the piezoelectric layer. Unfortunately, besides the desired TIE modes there are lateral modes, known as Rayleigh-Lamb modes, generated in the acoustic stack as well. The Rayleigh-Lamb modes are mechanical waves having k-vectors that are perpendicular to the direction of TE modes, the desired modes of operation. These lateral modes travel in the areal dimensions (x, y directions of the present example) of the piezoelectric material. Among other adverse effects, lateral modes deleteriously impact the quality (Q) factor of an FBAR device. In particular, the energy of Rayleigh-Lamb modes is lost at the interfaces of the FBAR device. As will be appreciated, this loss of energy to spurious modes is a loss in energy of desired longitudinal modes, and ultimately a degradation of the Q-factor.

FBARs comprise an active area comprising the region of overlap of the first and second electrodes, and the piezoelectric layer of the membrane, or acoustic stack. The desired mechanical properties and electrical characteristics of the membrane are dependent on the materials used to make up the membrane and their thicknesses. For example, the careful selection of the resonant frequency of the membrane is determined by the careful selection of the materials of the acoustic stack. As should be appreciated, in implementations of the FBAR such as electrical filters, the precision of the resonant frequency of the membrane is important to realize acceptable filtering.

Unfortunately, fabrication of the FBAR devices and exposure to the ambient after fabrication in operational use can result in changes in the materials, and therefore changes in the desired properties and characteristics of the FBAR. For example, exposure to moisture and air can result in the formation of undesired oxides on the membrane. The degree of formation of the oxides cannot be predicted with accuracy, and therefore cannot be accounted for during fabrication of the FBAR. These oxides can alter mechanical and electrical characteristics of the FBAR, such as the resonant frequency, increase electrical losses, and decrease the quality (Q) factor.

One approach to prevent exposure of the FBAR device includes hermetically packaging the acoustic stack before certain processing sequences are undertaken during fabrication. The acoustic stack is thereby protected from exposure of certain chemicals during fabrication and the FBARs are protected from exposure to the ambient after fabrication is completed. While hermetic packaging provides protection of the FBAR device, known hermetic packaging methods and structures add complexity to the manufacturing process and size to the final packaged FBAR device. As such, known hermetic packaging methods and structures can increase the overall size of the packaged FBAR device and the cost of the final packaged FBAR device. With the need for reduced size and cost of electronic components, known hermetic packaging methods present shortcomings.

What is needed, therefore, is an FBAR device and method of fabrication that overcomes at least the shortcomings described above.

SUMMARY

In accordance with a representative embodiment, an acoustic resonator comprises a substrate and a first passivation layer disposed over the substrate. The first passivation layer comprises a first layer of silicon carbide (SiC), and a layer of aluminum nitride (AlN) disposed between the first layer of SiC and a first electrode. The first electrode is disposed over the first passivation layer. The acoustic resonator further comprises a second electrode, and a piezoelectric layer disposed between the first and second electrodes. The acoustic resonator also comprises a second passivation layer disposed over the second electrode. The second passivation layer comprises a second layer of silicon carbide (SiC).

In accordance with another representative embodiment, an electrical filter comprises an acoustic resonator. The acoustic resonator comprises a substrate and a first passivation layer disposed over the substrate. The first passivation layer comprises a first layer of silicon carbide (SiC), and a layer of aluminum nitride (AlN) disposed between the first layer of SiC and a first electrode. The first electrode is disposed over the first passivation layer. The acoustic resonator further comprises a second electrode, and a piezoelectric layer disposed between the first and second electrodes. The acoustic resonator comprises a second passivation layer disposed over the second electrode. The second passivation layer comprises a second layer of silicon carbide (SiC).

In accordance with another representative embodiment, a method of fabricating an acoustic resonator is disclosed. The method comprises: forming a first passivation layer comprising a first layer of silicon carbide (SiC) over a substrate, and forming a first layer of aluminum nitride over the first layer of SiC. The method further comprises forming a first electrode over the first passivation layer; forming a piezoelectric layer over the first electrode; forming a second electrode over the piezoelectric layer; and forming a second first passivation layer comprising a second layer of silicon carbide (SiC) over the second electrode.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DEFINED TERMINOLOGY

Figure 1A:
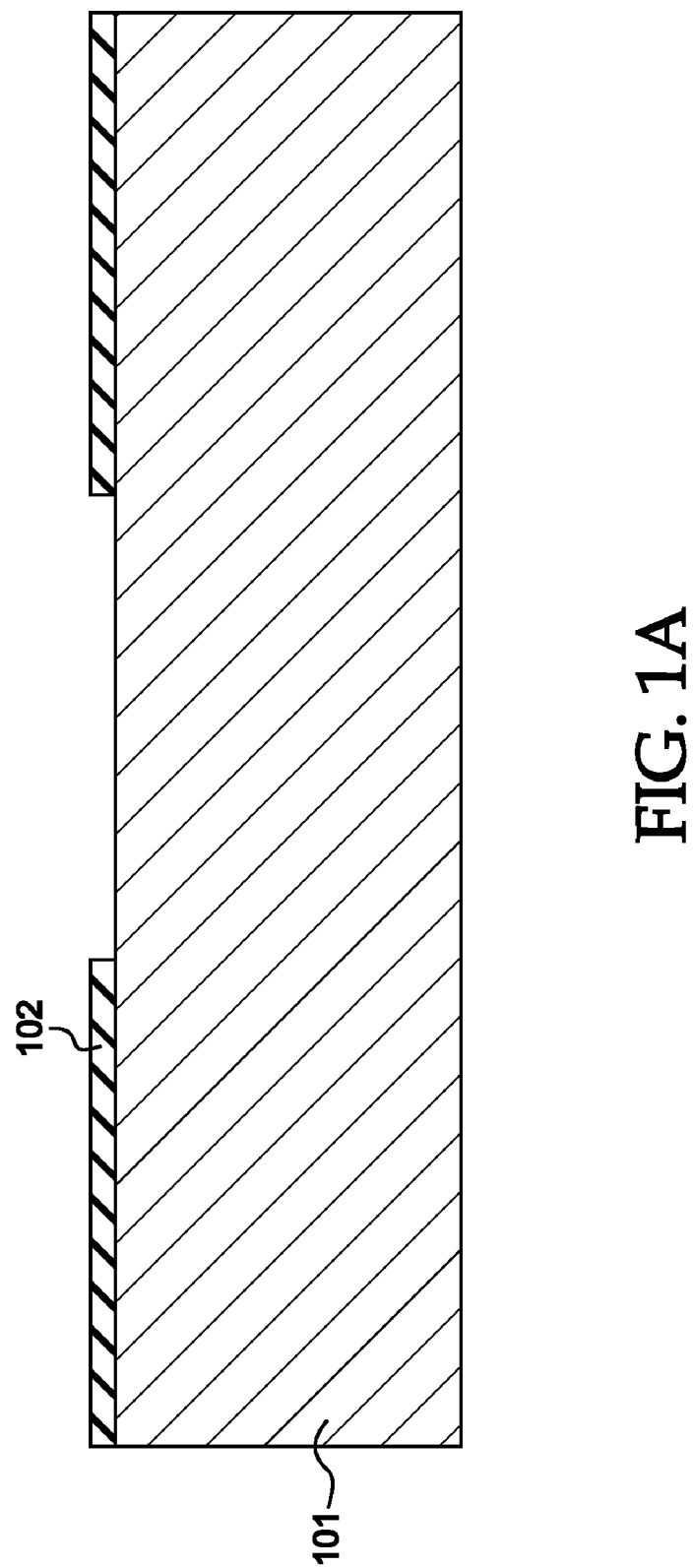
FIGS. 1A-1S are cross-sectional views illustrating a method of fabricating an acoustic resonator in accordance with a representative embodiment.

It is to be understood that the terminology used herein is for purposes of describing particular embodiments only, and is not intended to be limiting. The defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly dictates otherwise. Thus, for example, 'a device' includes one device and plural devices.

As used in the specification and appended claims, and in addition to their ordinary meanings, the terms 'substantial' or 'substantially' mean to with acceptable limits or degree. For example, 'substantially cancelled' means that one skilled in the art would consider the cancellation to be acceptable.

As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same.

DETAILED DESCRIPTION

In the following detailed description, for purposes of explanation and not limitation, specific details are set forth in order to provide a thorough understanding of illustrative embodiments according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of known apparatuses, materials and methods may be omitted so as to not obscure the description of the illustrative embodiments. Such methods and apparatus are within the scope of the present teachings.

Generally, it is understood that the drawings and the various elements depicted therein are not drawn to scale. Moreover, relative terms such as "above," "below," "top," "bottom," "upper" and "lower" are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be "below" that element.

Representative embodiments relate generally to acoustic resonators. Acoustic resonators described in connection with the representative embodiments are bulk acoustic wave (BAWs) resonators. Certain representative embodiment are described in connection with film bulk acoustic resonators (FBARs), which is a type of BAW device mounted over air or a void. Commonly, FBARs comprise an acoustic membrane provided over a cavity in a substrate. Alternatively, FBARs comprise an acoustic membrane 'raised' up in a region over a substrate with a void (e.g., 'air') between an upper surface of the substrate and the lower surface of the acoustic membrane. Still alternatively, FBARs comprise an acoustic membrane disposed over an acoustic mirror comprising alternating layers of comparatively low acoustic impedance and high acoustic impedance. The layers of the acoustic mirror have a selected thickness (e.g., $\lambda/4$) to improve the performance of the FBAR. It is emphasized that the BAWs described in connection with the representative embodiments are intended to illustrate certain features described in connection with these embodiments, and are not intended to be limiting. As such, alternative structures comprising BAW devices that will be apparent to one of ordinary skill in the art having had the benefit of the present disclosure are also contemplated. Finally, other types of BAW devices are contemplated. These include, but are not limited to stack bulk acoustic resonators (SBARs), double bulk acoustic resonators (DBARs) and coupled resonator filters (CRFs).

Figure 1B:
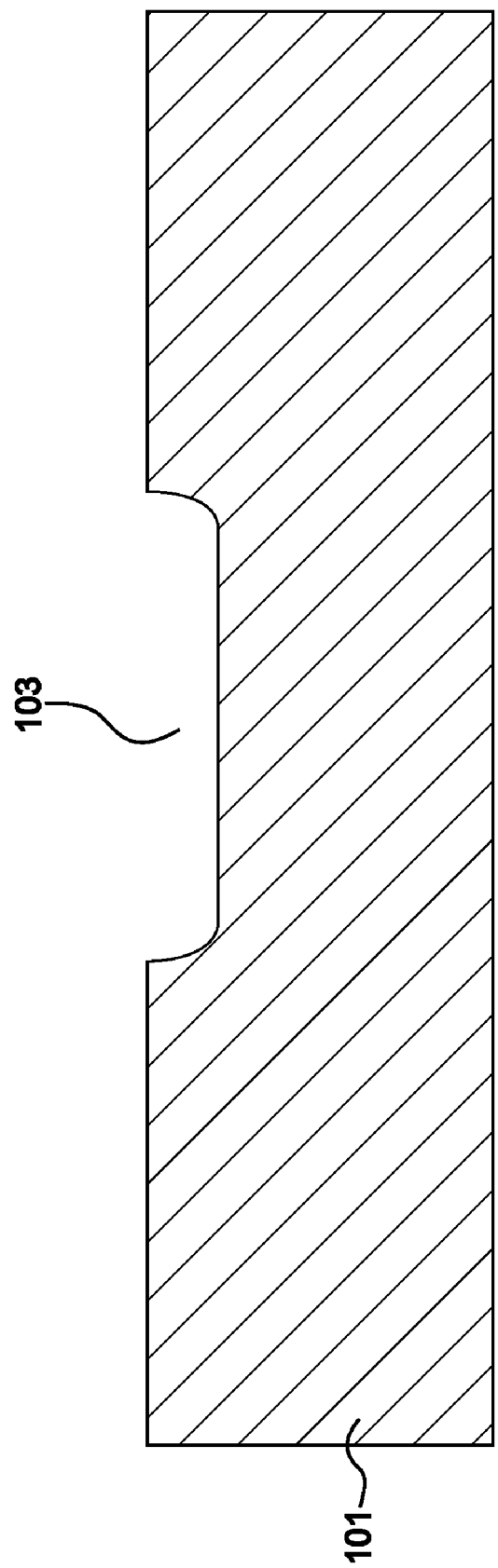
Figure 1C:
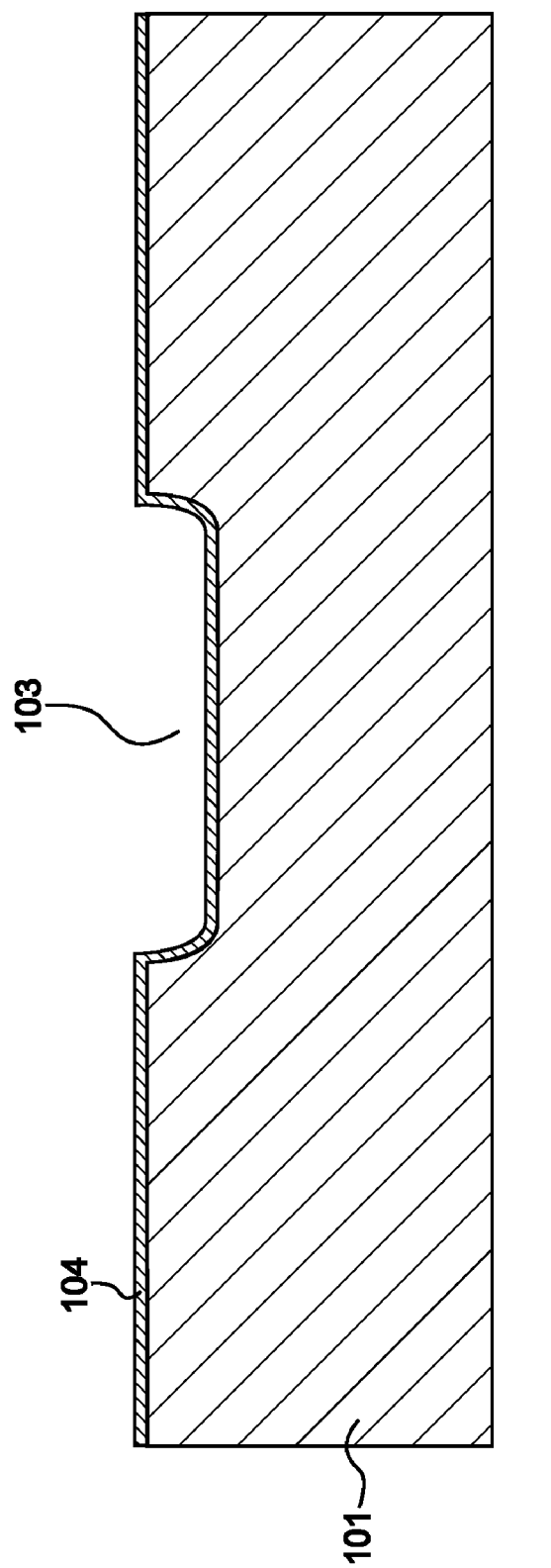
Figure 1D:
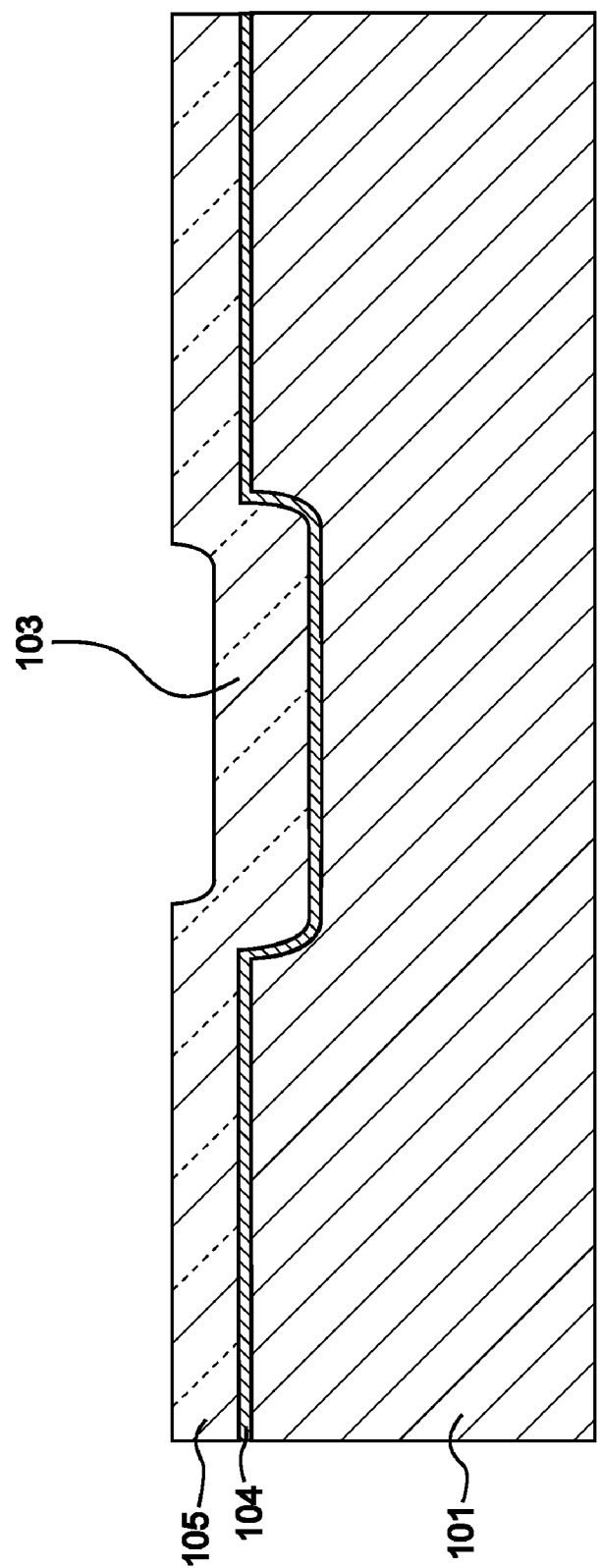
Figure 1E:
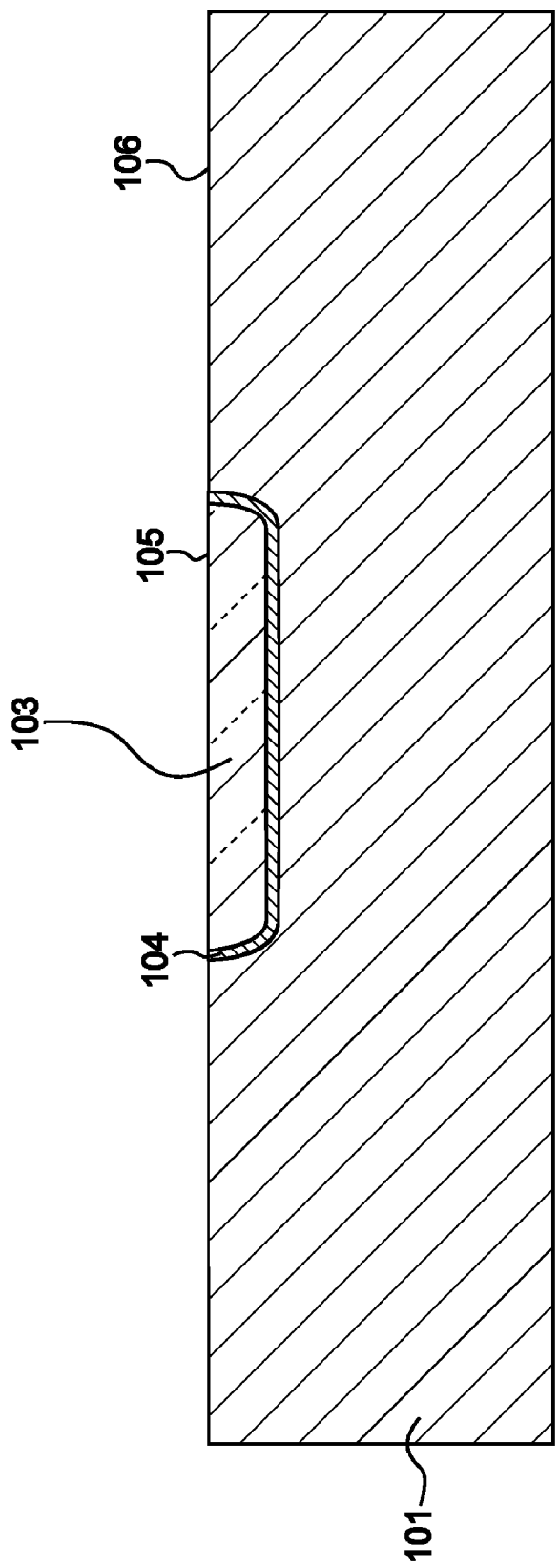
Figure 1F:
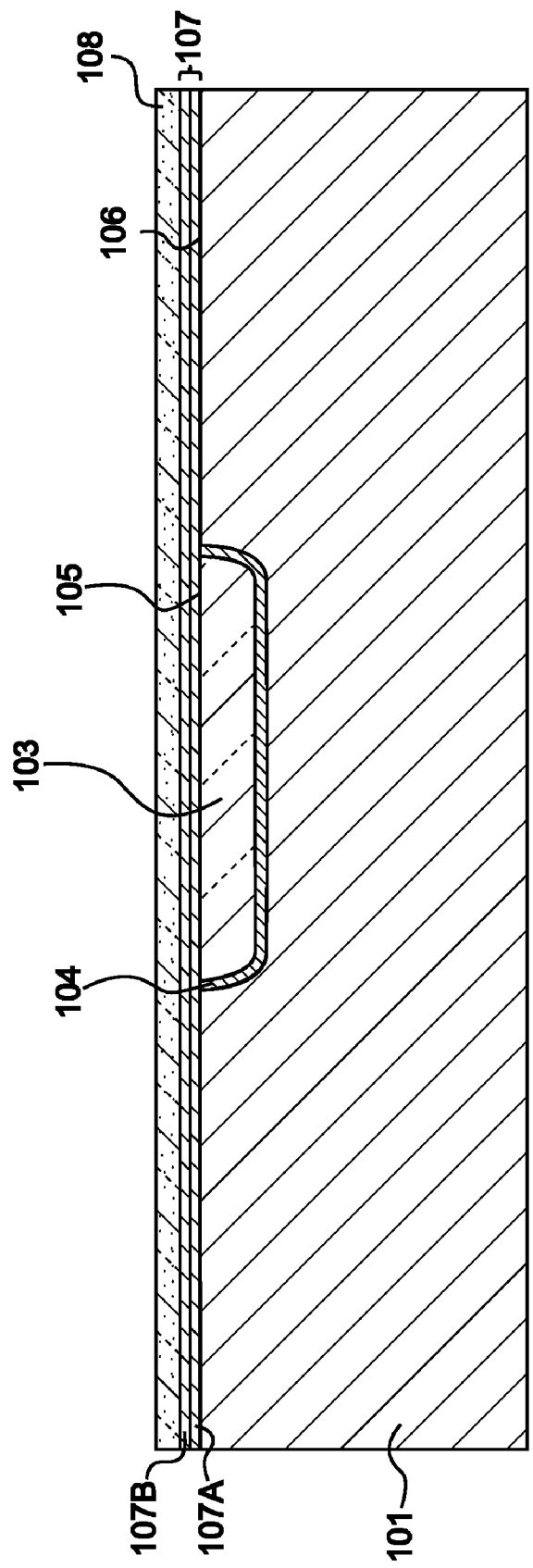
Figure 1G:
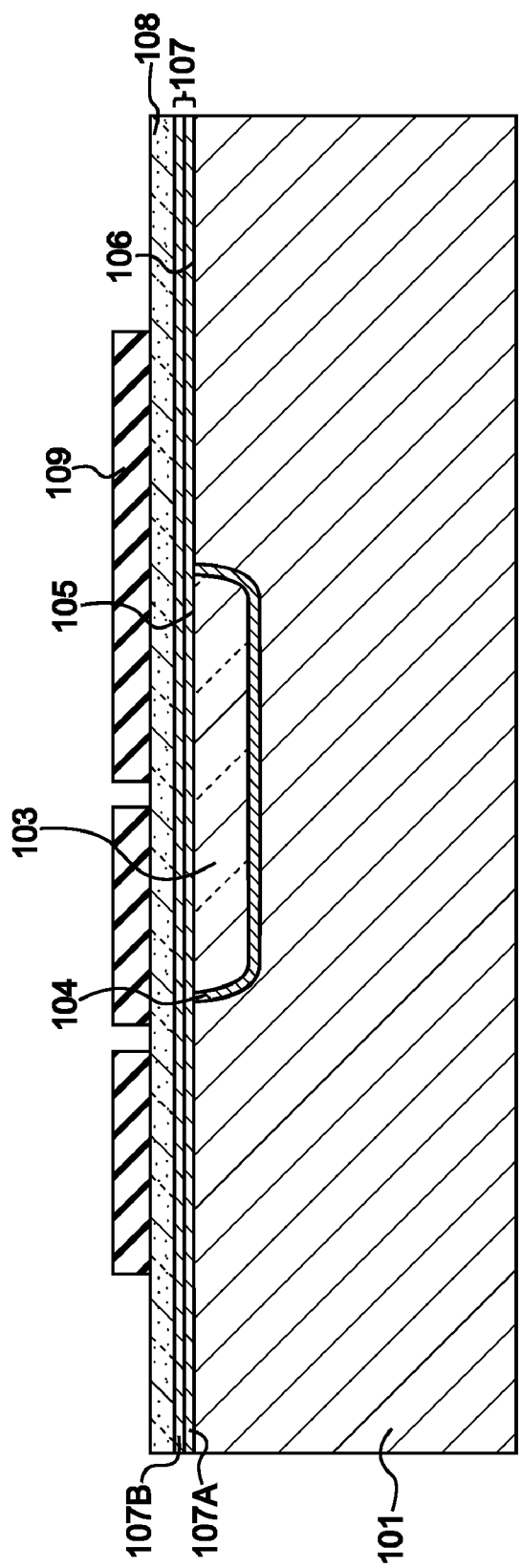
Figure 1H:
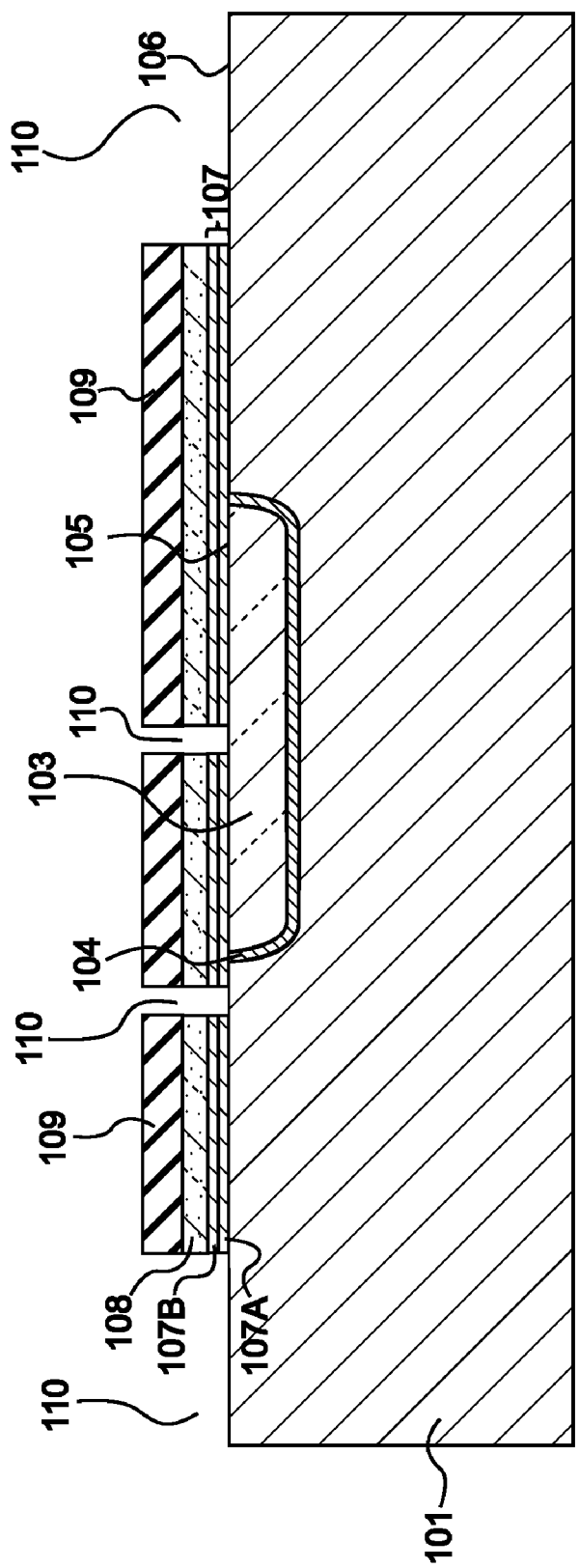
Figure 1I:
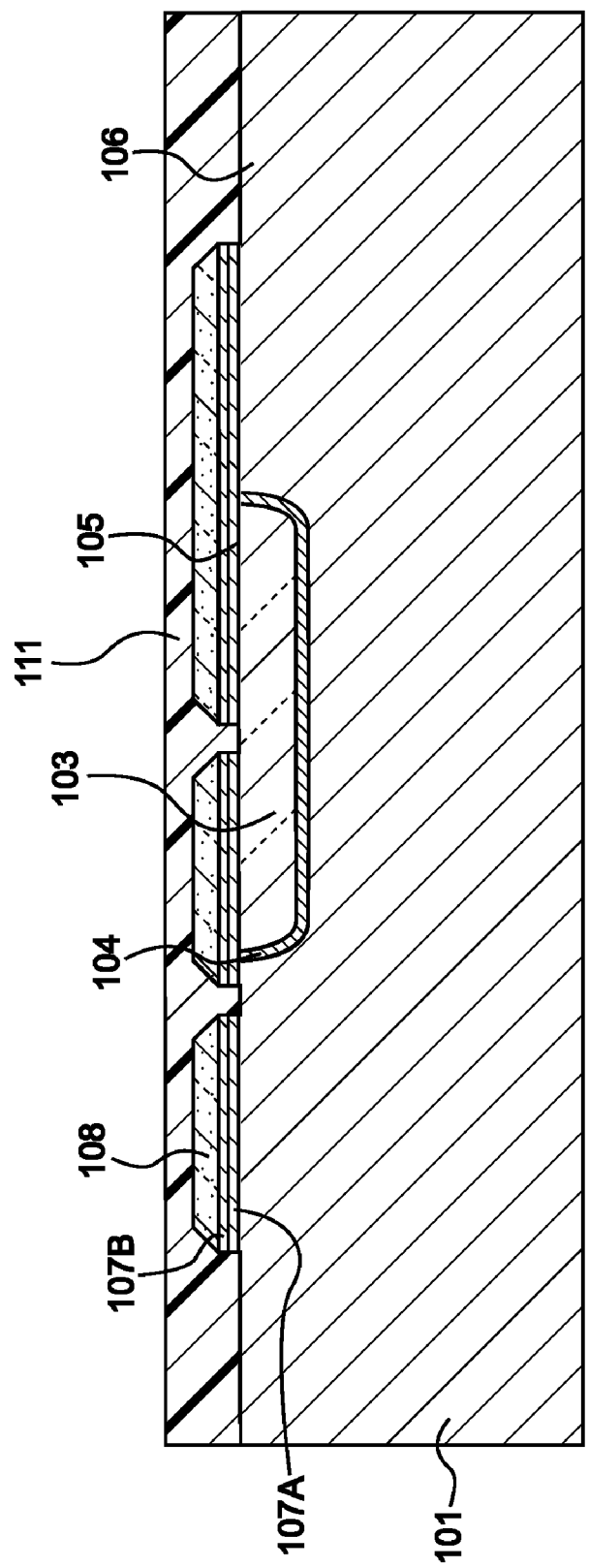
Figure 1J:
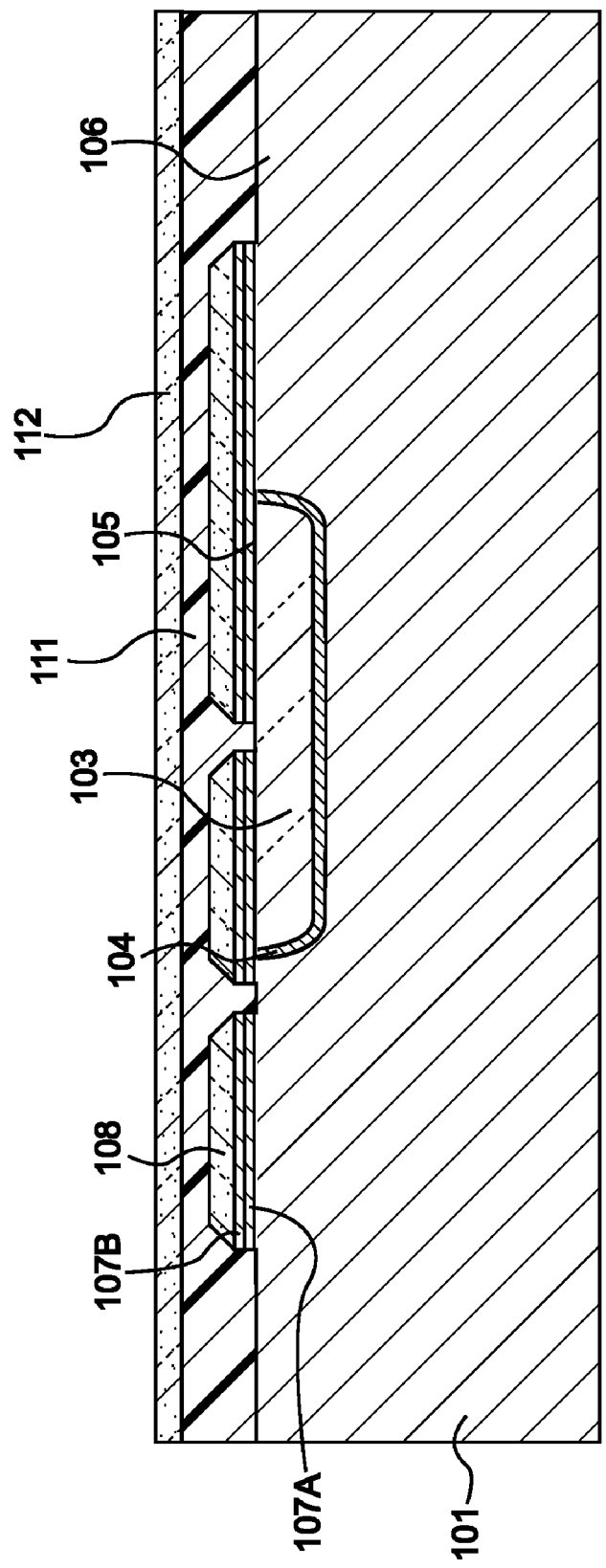
Figure 1K:
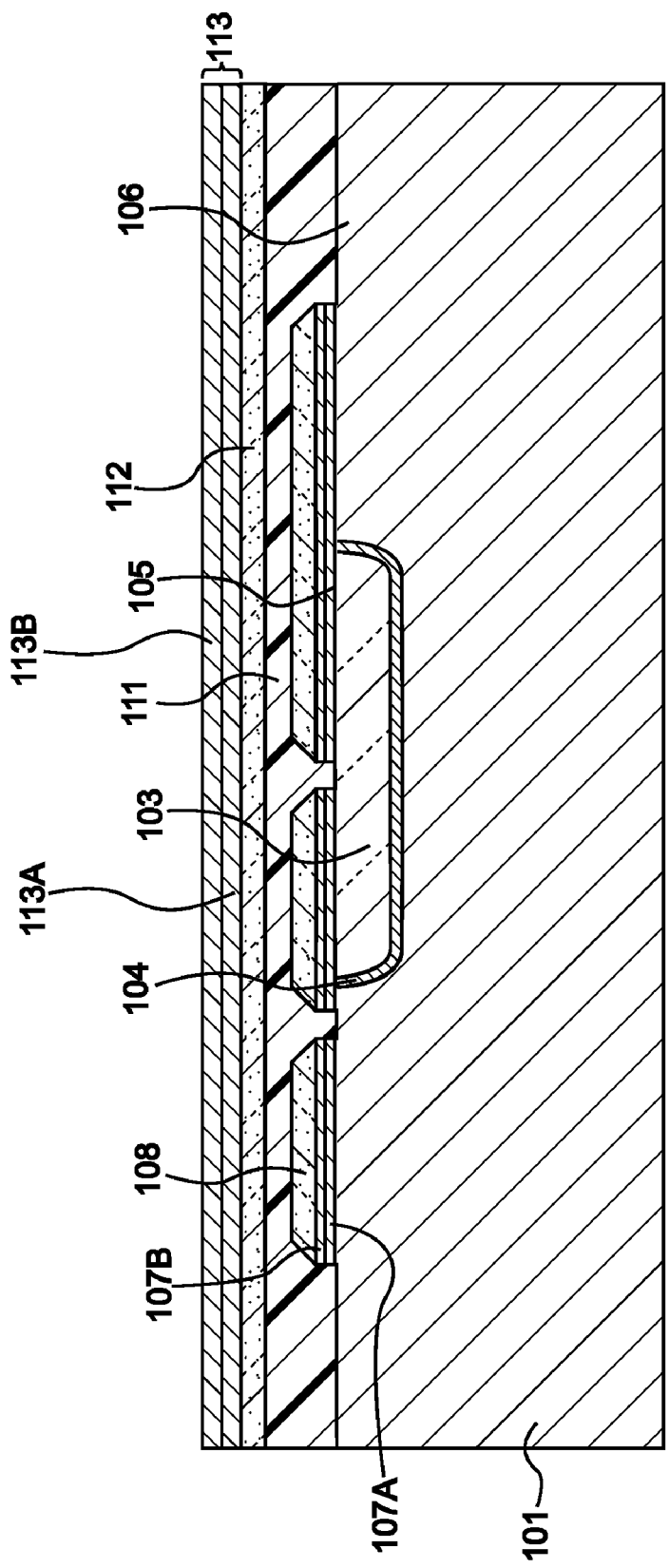
Figure 1L:
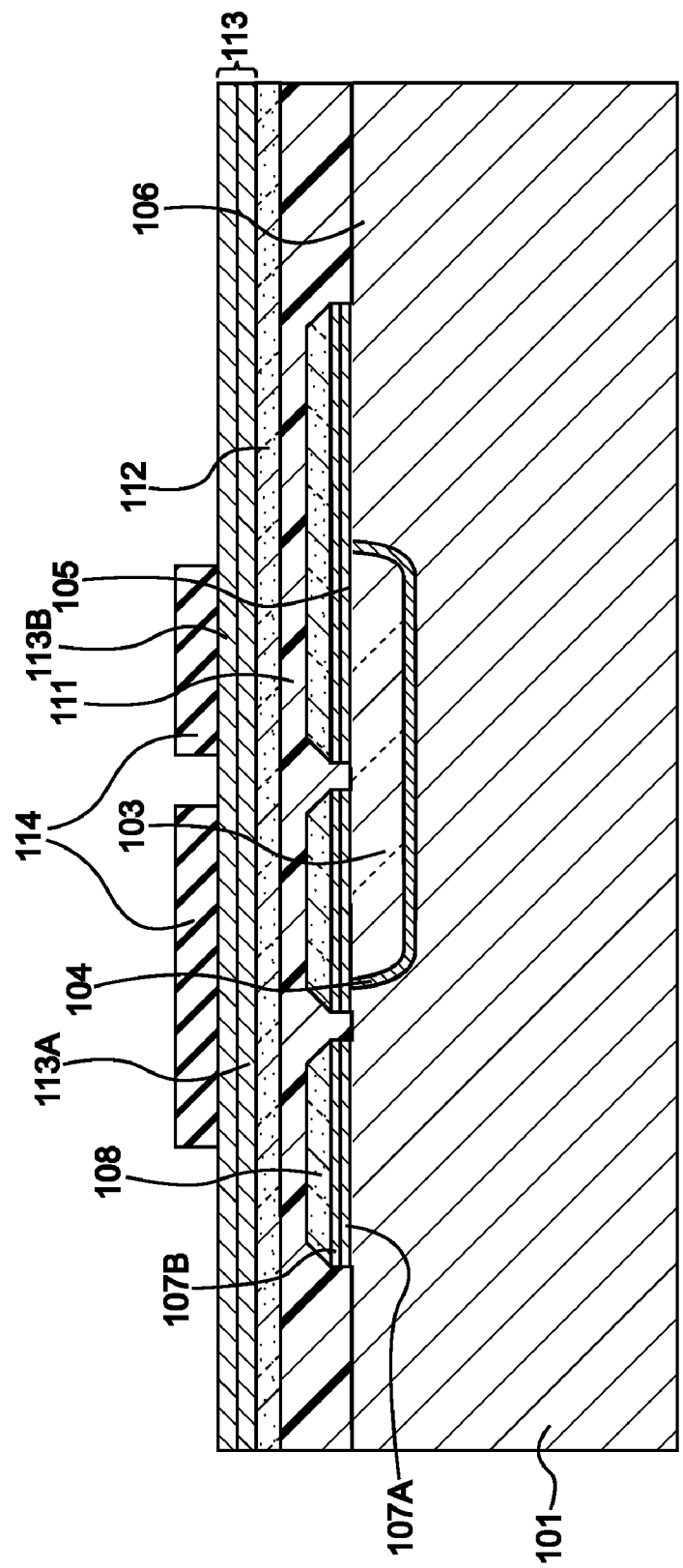
Figure 1M:
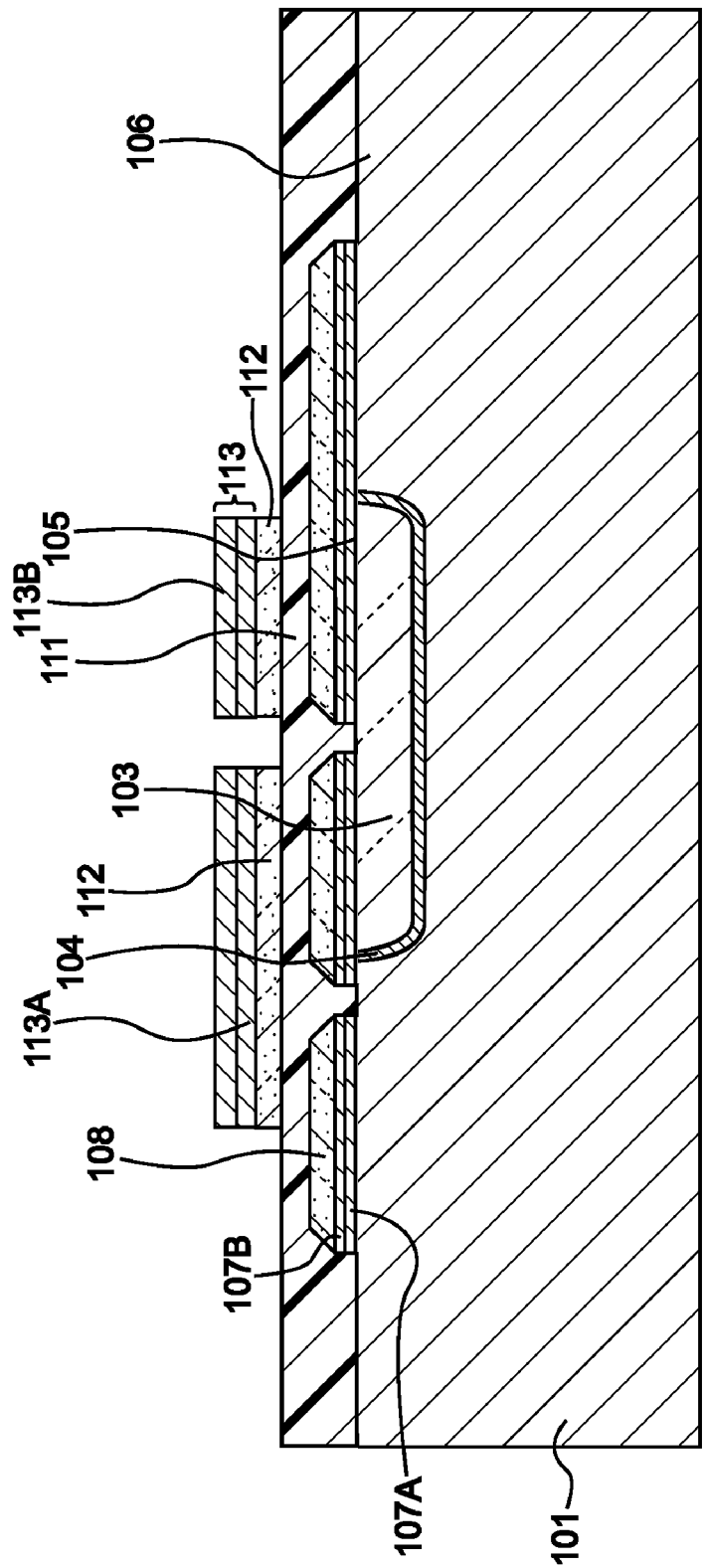
Figure 1N:
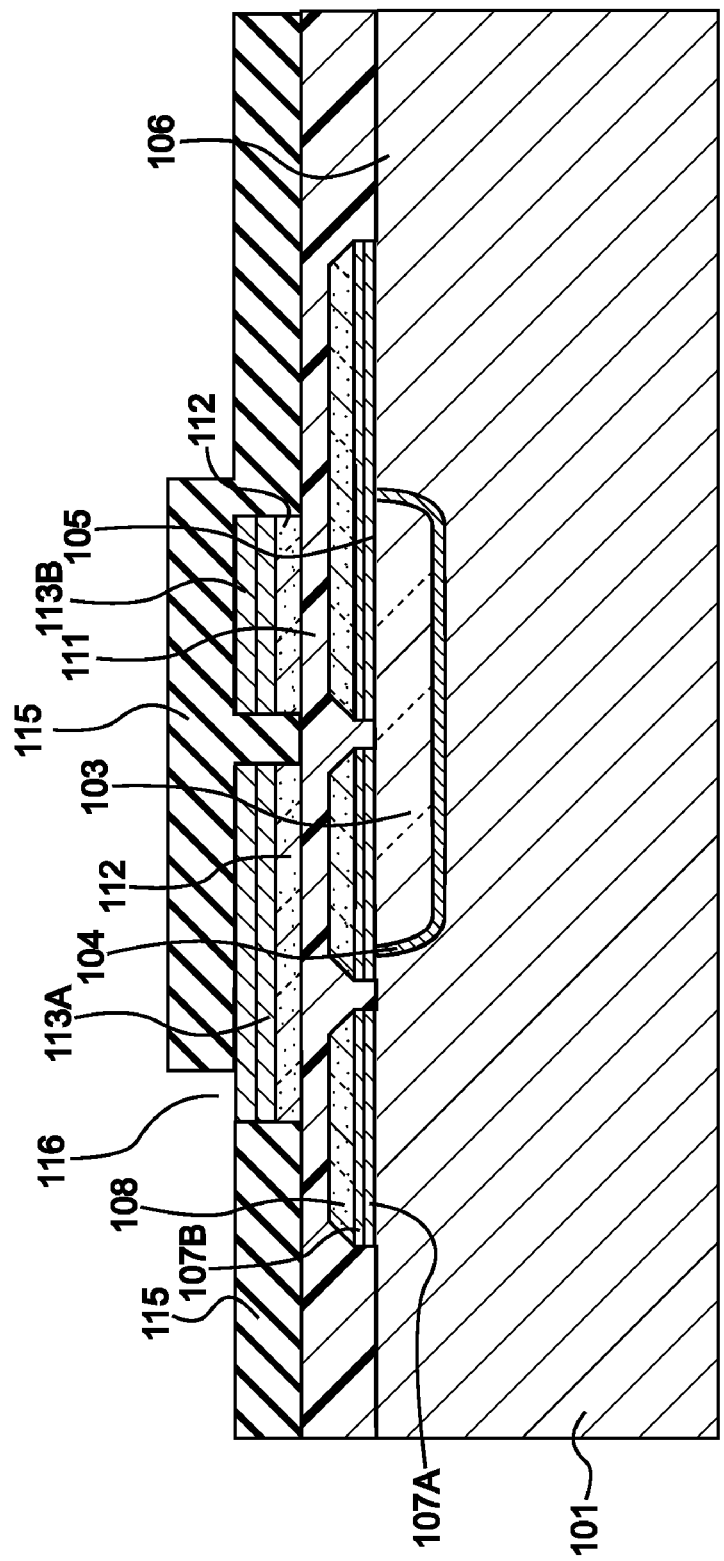
Figure 1O:
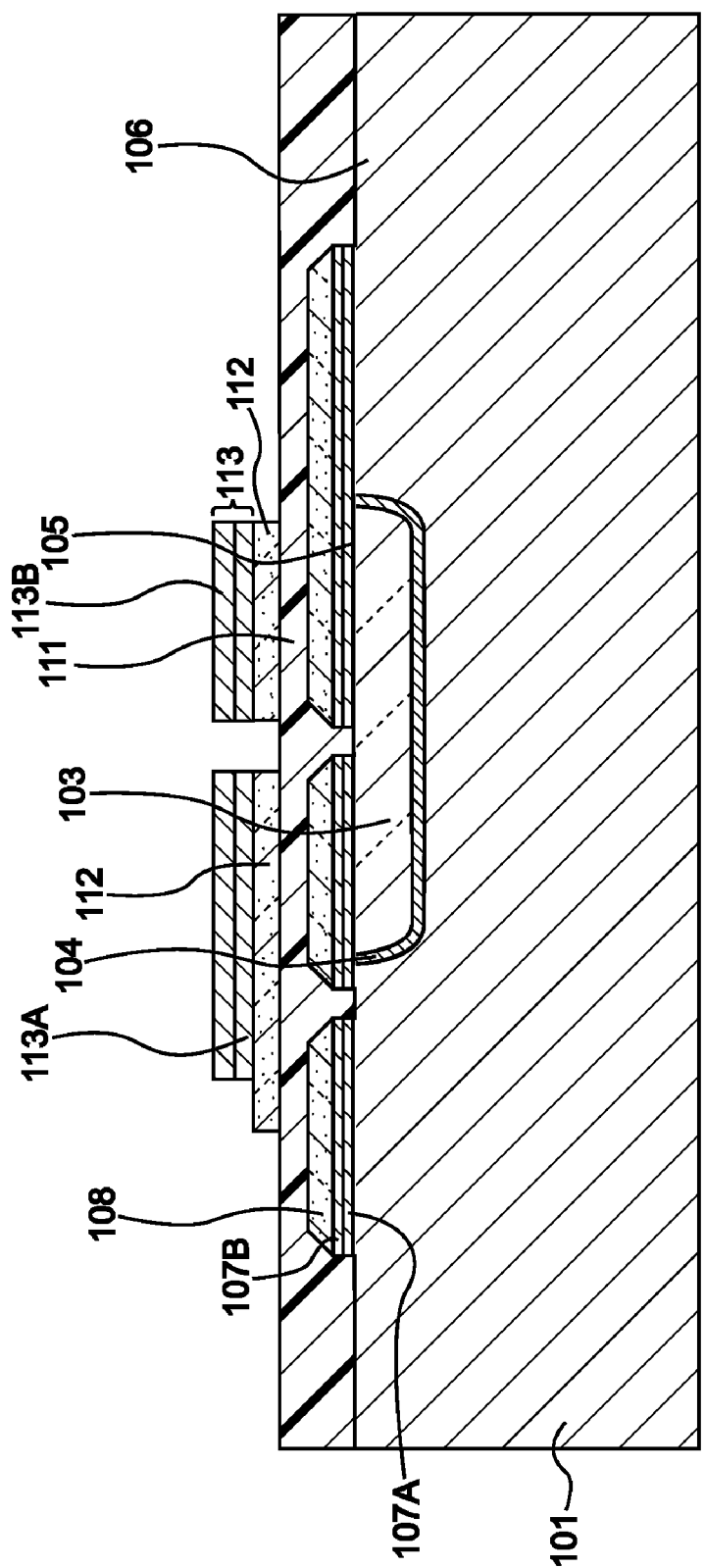
Figure 1P:
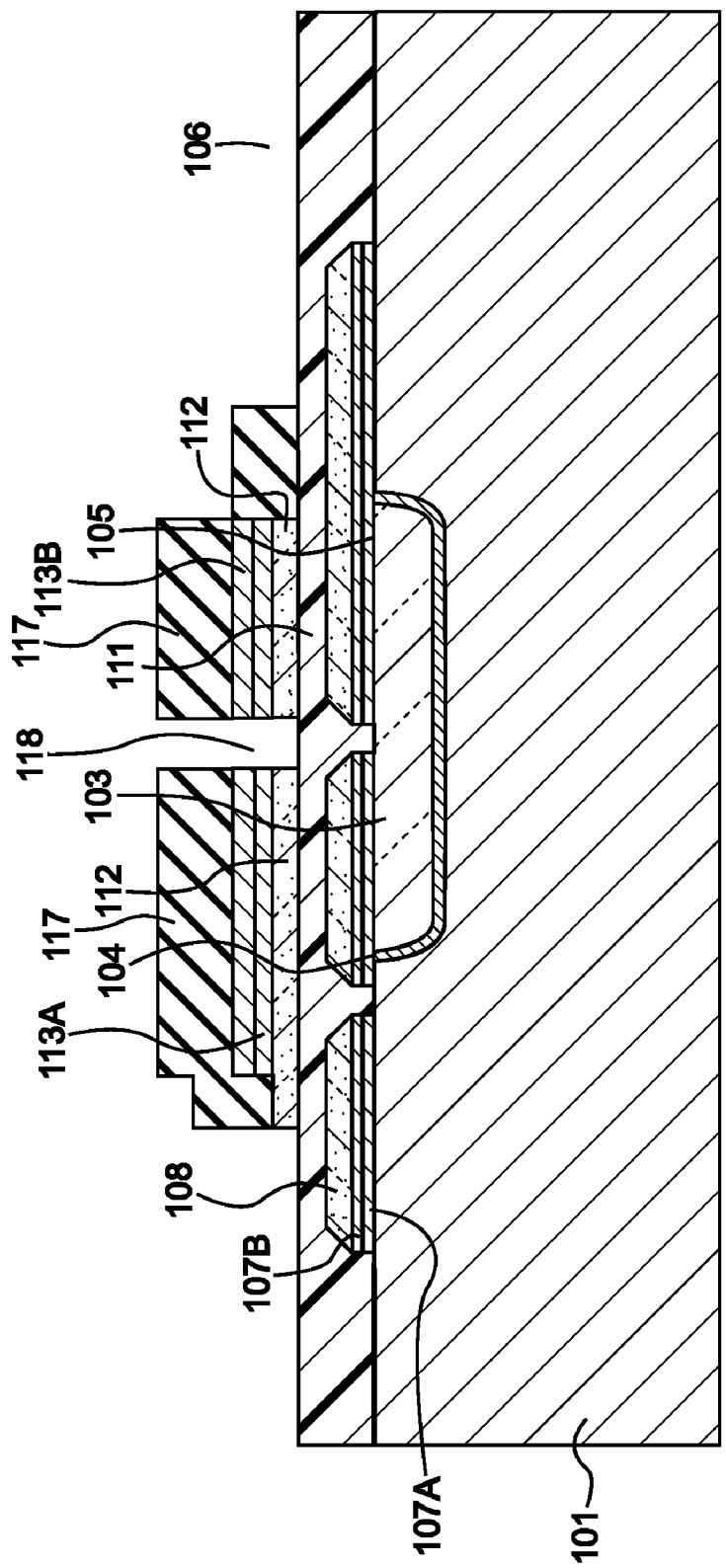
Figure 1Q:
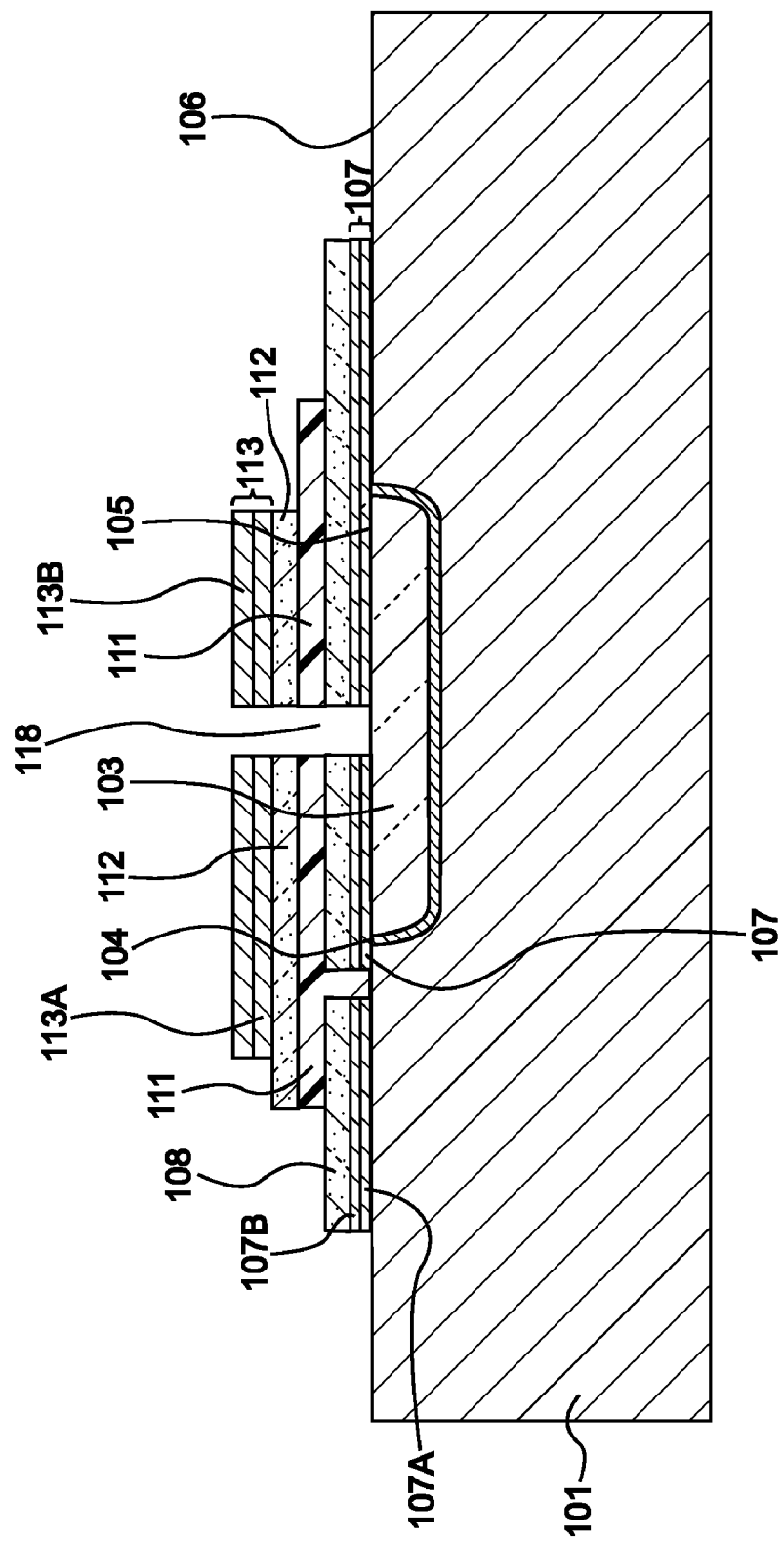
Figure 1R:
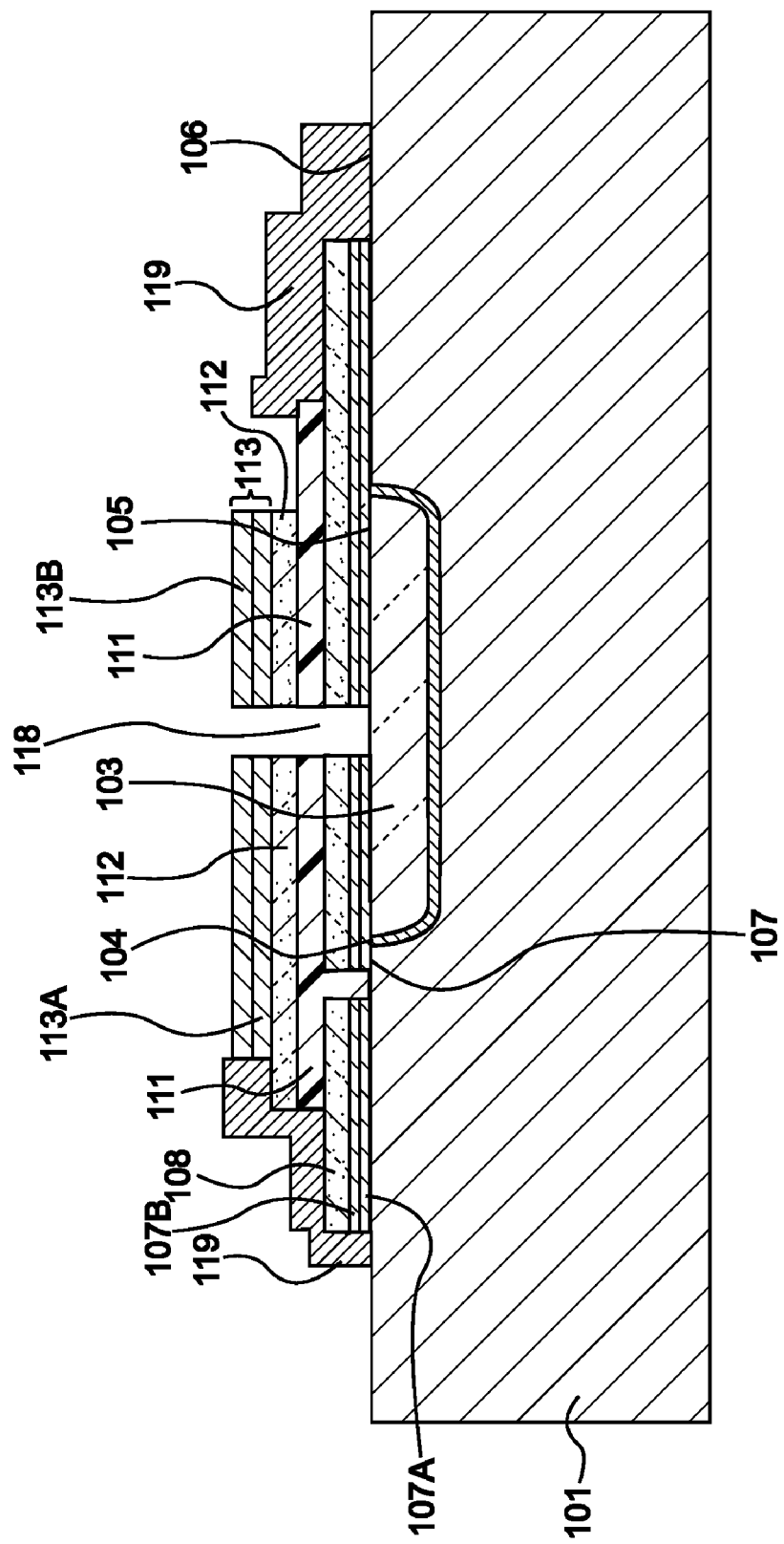
Figure 1S:
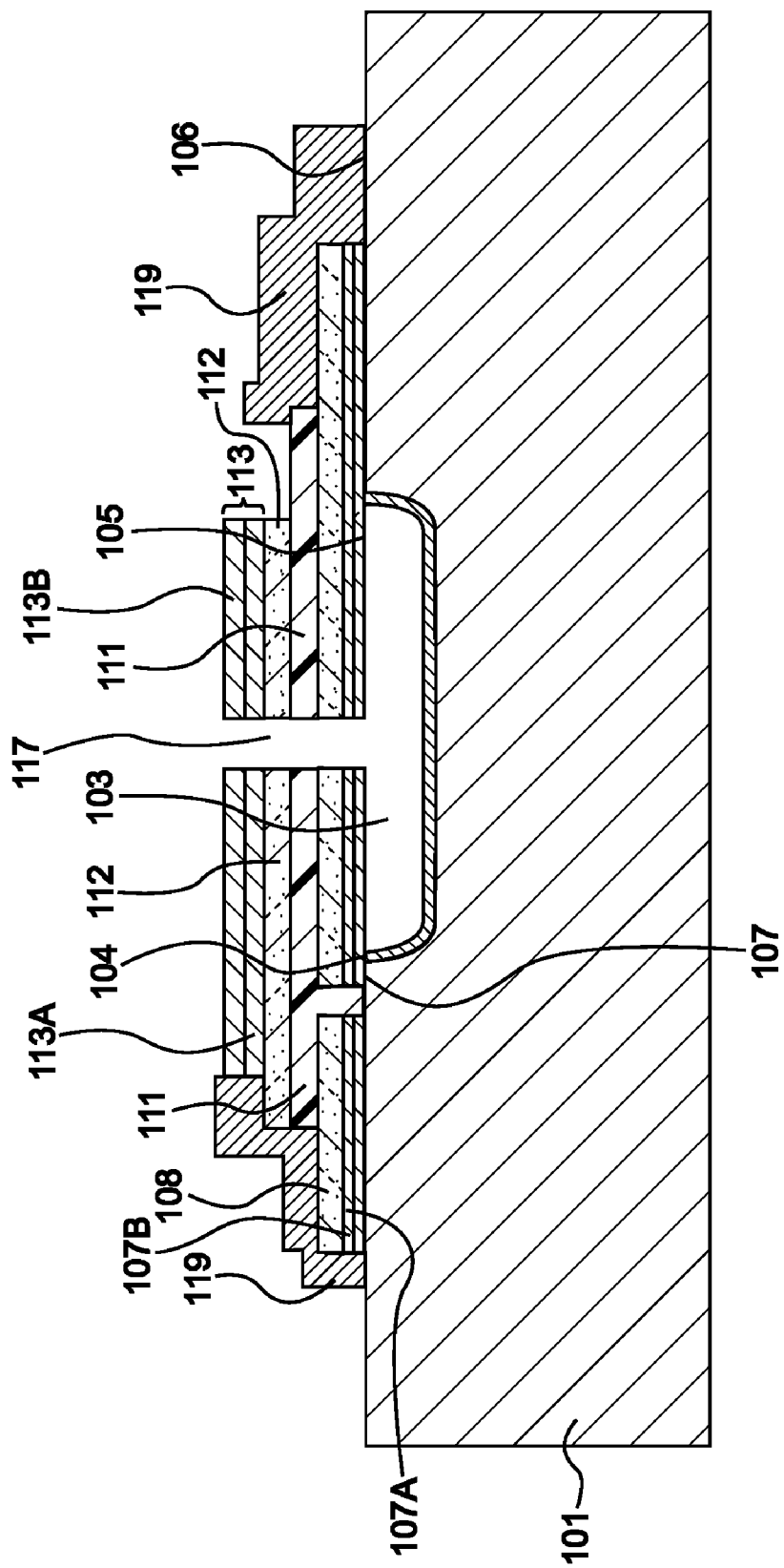

FIGS. 1A-1S are cross-sectional views illustrating a method of fabricating an acoustic resonator in accordance with a representative embodiment. Many materials and methods may be used to fabricate the acoustic resonator comprising various structures and topologies in accordance with representative embodiments. Details of known fabrication methods and materials are often not provided. Notably, details of the formation of the acoustic resonators of the representative embodiments may be as described, for example, in one or more of the following commonly owned U.S. Pat. Nos. 5,587,620; 5,873,153; 6,384,697; 6,507,983; and 7,275,292 to Ruby, et al.; 6,828,713 to Bradley, et. al; 7,714,684 to Ruby, et al.; 7,280,007 to Feng, et al.; and commonly owned U.S. Patent Application Publication 20070205850 to Jamneala, et al. The disclosures of these patents and patent application publications are specifically incorporated herein by reference. It is emphasized that the methods and materials described herein and in the referenced patents and patent application publications are merely representative, and other methods and materials and variations thereof will become apparent to one of ordinary skill in the art having had the benefit of review of the present disclosure. These alternate methods, materials and variations thereof are contemplated by the present teachings.

FIG. 1A shows a substrate 101, which is illustratively crystalline silicon (Si), with photoresist 102 formed thereover. A cavity 103 is provided in the substrate as shown in FIG. 1B. As will become clearer as the present description continues, the cavity 103 will provide a void (air) beneath an acoustic membrane to provide an FBAR in accordance with a representative embodiment.

FIG. 1C shows the formation of a layer 104 of barrier material over the substrate 101 and the surface of the cavity 103. The layer 104 may be aluminum nitride (AlN) or an oxide (e.g., $SiO_2$) useful in preventing the interaction of a sacrificial material with the substrate 101.

FIG. 1D shows the sacrificial layer 105 after deposition. In a representative embodiment, the sacrificial layer 105 comprises phosphosilicate glass (PSG) deposited using a known technique and at a thickness at least equal to the depth of the cavity 103.

FIG. 1E shows the substrate 101 with the sacrificial layer 105 after planarization by a known method such as chemical mechanical polishing (CMP) so that the sacrificial layer 105 in the cavity 103 is substantially flush with an upper surface 106 of the substrate 101. Formation of the cavity 103 and the sacrificial layer 105 therein may be effected as discussed in U.S. Pat. No. 6,384,697 to Ruby, et al., entitled "Cavity Spanning Bottom Electrode of a Substrate-Mounted Bulk Wave Acoustic Resonator" and incorporated herein by reference above.

FIG. 1F shows the formation of a first passivation layer 107 over the upper surface 106 of the substrate 101 and the sacrificial layer 105, which is disposed in the cavity 103. In a representative embodiment, the first passivation layer 107 comprises a first layer 107A, which comprises SiC, and a second layer 107B disposed over the first layer 107A. In accordance with a representative embodiment, the second layer 107B of the first passivation layer 107 comprises a seed layer useful in promoting a preferred crystallographic orientation of the piezoelectric layer of the acoustic stack. For example, to promote the c-axis orientation of an AlN piezoelectric layer, the second layer 107B comprises AlN. In another representative embodiment, the first passivation layer 107 comprises only the first layer 107A. In still other representative embodiments, the first passivation layer 107 comprises additional layers (not shown) disposed over the first layer 107A. Thus, in one representative embodiment, the first passivation layer 107 comprises only the first layer 107A (SiC), and in other representative embodiments, the first passivation layer 107 comprises the first layer 107A (SiC) and one or more additional layers disposed thereover. As will become clearer as the present description continues, regardless of the number of layers provided in the first passivation layer, the layer closest to the upper surface 106 of the substrate 101 (e.g., first layer 107A shown in the representative embodiment of FIG. 1F) is SiC.

In a representative embodiment, the first layer 107A of SiC is deposited using a known process such as plasma enhanced chemical vapor deposition (PECVD) at a temperature of approximately 350° C. to approximately 450° C. using trimethylsilane ($(CH3)_3SiH$) as a source for silicon and carbon combined with a carrier gas such as helium. Alternatively, other known gas sources and carrier gases useful to effect PECVD SiC deposition are contemplated.

The PECVD deposition conditions (power, pressure, gas flow ratio) are controlled to provide a substantially uniform deposition rate of SiC across the substrate 101. By way of illustration, using a known PECVD system, a helium to trimethylsilane gas ratio of 4:1 with a total pressure of 3.5 Torr and deposition power of 375 W are used. In addition, these PECVD conditions, which will be dependent upon specific deposition chambers, are chosen to maximize the formation of Si to C bonds in the deposited film and to minimize the formation of C-to-H and Si-to-H bond species. These bond states in the SiC layer can be monitored using Fourier Transform Infrared Spectroscopy (FTIR).

Alternatively, the first layer 107A may be deposited by one of a number of known sputtering deposition techniques. Illustrative sputtering techniques include radio frequency (RF) sputtering of a SiC target; or reactive sputtering of a Si target in a hydrocarbon gas, for example methane ($CH_4$). The RF sputtering technique has an advantage over the PECVD or reactive sputtering deposition of SiC by eliminating the incorporation of hydrogen in the film that may diminish the mechanical properties of the film and reduce the performance of the acoustic resonator.

The first layer 107A of SiC layer need only be sufficiently thick to provide a continuous film substantially free from pin hole defects. Illustratively, a thickness of several hundred Angstroms (Å) will accord such a layer. In a representative embodiment, the first layer 107A comprises a layer of SiC having a thickness of approximately 300 Å, and the second layer 107B of AlN has a thickness of approximately 300 Å. It is emphasized that the noted thicknesses of the first layer 107A and the second layer 107B is merely illustrative and other thicknesses are contemplated.

The selection of deposition method of the first layer 107A (SiC layer) of the first passivation layer 107 can dictate the need for additional processing steps, or passivation materials (e.g., second layer 107B), or both. For example, PECVD may be used to fabricate the first layer 107A layer of the first passivation layer 107. However as noted above, the resultant SiC layer may have contaminants such as hydrogen and carbon that are used in the PECVD process. These contaminants could result in a more amorphous layer of SiC and alter the mechanical and elastic properties of the acoustic resonator. As such, while superior protection of the acoustic resonator compared to known passivation materials is attained by the use of SiC as the passivation material, an undesirable alteration of the acoustic properties of the acoustic resonator from that which is expected and desired may result. In accordance with a representative embodiment, an annealing sequence can be carried out in an effort to remove the contaminants that result from the PECVD process. In an illustrative embodiment, the anneal step is effected at temperatures above approximately 450° C. As should be appreciated, the anneal step is completed after fabrication of the acoustic resonator.

Beneficially, SiC provides superior passivation and thus improved protection of overlying or underlying layers during fabrication and operation of the acoustic resonator. During operation, the first layer 107A protects overlying layers from oxidation and moisture. Accordingly, in a representative embodiment, the first layer 107A provides the 'outer' layer of the first passivation layer 107 to provide protection; and the first layer 107A (SiC layer) is provided over the upper surface 106 of the substrate 101 and the sacrificial layer 105, and the second layer 107B (e.g., AlN) is provided over first layer 107A (SiC). By being positioned as the outermost layer, the SiC layer is exposed to the ambient during fabrication of subsequent layers and structures, and to the ambient during operation (e.g., air in the cavity 103 left after removal of the sacrificial layer 105). Moreover, while the second layer 10713 of the first passivation layer 107 can provide protection, as noted above, it may be provided to facilitate the formation of subsequent layers. Thus, in accordance with a representative embodiment, the first passivation layer 107 provides the superior passivation from the SiC, and the predictable acoustic properties of AlN in the acoustic resonator. In a representative embodiment, the deposition of second layer 107B of AlN may be as described in commonly owned U.S. Pat. No. 7,275,292 to Ruby, et al. The entire disclosure of U.S. Pat. No. 7,275,292 is specifically incorporated herein by reference.

Returning to FIG. 1F, after the fabrication of the first passivation layer 107 comprising one or more layers described above, a first electrode layer 108 is provided over the first passivation layer 107 by sputtering or other deposition processes. In accordance with a representative embodiment, the first electrode layer 108 comprises a suitable conductive material such as molybdenum (Mo). The morphology of the bottom electrode material can impact the crystal orientation of the subsequent piezoelectric layer and thus influence the Q-factor of the acoustic resonator. Accordingly, and as described above, one or more additional thin layers (e.g., second layer 107B, which may be a 300 Å thick layer of AlN) may be provided in between the first layer 107A and the first electrode layer 108 to optimize the grain structure of the piezoelectric layer of the acoustic resonator.

FIG. 1G shows the formation and patterning of a photoresist 109 over the first electrode layer 108. This photoresist allows for the selective removal of portions of the first electrode layer 108 and first passivation layer 107 to provide the first electrode described below.

FIG. 1H shows the exposed portions 110 of the substrate 101 and sacrificial layer 105 after dry etching with the photoresist 109 to pattern the first electrode layer 108 and first passivation layer 107, and to reveal a vent through to the sacrificial layer 105 that is used to remove the sacrificial layer 105 and form the cavity 103. The dry etching can be done in an $SF_6$ chemistry by known methods.

FIG. 1I shows the formation of a piezoelectric layer 111 over the (patterned) first electrode layer 108 and upper surface 106 of the substrate 101. The piezoelectric layer 111 comprises a known piezoelectric material useful in BAW devices and is illustratively AlN.

FIG. 1J shows the formation of a second electrode layer 112 over the piezoelectric layer 111. The second electrode layer 112 illustratively comprises the same material as the first electrode layer 108 and is deposited by a known method such as sputtering.

FIG. 1K shows the formation of a second passivation layer 113 over the second electrode layer 112. Illustratively, the second passivation layer 113 comprises a first layer 113A and a second layer 113B. The second layer 113B comprises SiC. In a representative embodiment, the first layer 113A comprises a layer of AlN that can be used as a "hard mask" for use in etching the second electrode layer 112, as described in the above-referenced U.S. Pat. No. 7,275,292 to Ruby et al. Beneficially, the use of a hard mask provides a more accurate definition of the second electrode than is achieved with the use of a photoresist mask. In another representative embodiment, the second passivation layer 113 comprises only a layer of SiC (e.g., only second layer 113B). In still other representative embodiments, the second passivation layer 113 comprises additional layers (not shown) disposed beneath the second layer 113B. Thus, in a representative embodiment, the second passivation layer 113 comprises only a layer of SiC, and in other representative embodiments, the second passivation layer 113 comprises the second layer 113B (SiC) and one or more additional layers disposed beneath the second layer 113B. Regardless of the number of layers provided in the second passivation layer 113, the layer exposed to the ambient (e.g., layer 113B) is SiC.

The second passivation layer 113 may be fabricated by PECVD or sputter deposition in substantially the same manner as the first passivation layer 107. Similar to the configuration of the first passivation layer 107, in order to benefit from the superior protection of SiC, regardless of the other layer(s) included in the second passivation layer 113, the SiC layer (e.g., second layer 113B) is provided as the outer-most layer of the second passivation layer 113, with other layer(s) (e.g., first layer 113A) provided beneath the SiC layer and over the second electrode layer 112. As such, the opposing layers of the active area of the acoustic resonator are the SiC layers of the respective first passivation layer 107 and the second passivation layer 113.

FIG. 1L shows a patterned photoresist 114 formed over the passivation layer 113 to define the area of the second electrode. A dry etching process such as with $SF_6$ may be used to selectively etch the unprotected area of the SiC. If an AlN hard mask is used beneath the SiC, this AlN layer can be then etched using chlorine ((Cl2) dry etching. The second electrode layer 112 is illustratively etched with $SF_6$. The result is shown in FIG. 1M after removal of the patterned photoresist 114.

FIG. 1N shows a patterned photoresist 115 provided over the second passivation layer 113. The resist includes openings (e.g., openings 116) to allow the etching of the second passivation layer 113 to allow electrical connections to be made to the second (patterned) second electrode layer 112.

FIG. 1O the remaining structure after a dry etching process (such as by using $SF_6$) is used to remove the exposed portions of the second passivation layer 113.

FIG. 1P shows a patterned photoresist 117 provided for the selective removal of the piezoelectric layer 111. Opening 118 is provided in the patterned photoresist 117 to allow for the removal of the piezoelectric layer 111 and the eventual formation of a vent for removal of the sacrificial layer 105 from the cavity 103 formed in the substrate 101.

FIG. 1Q shows the remaining structure after a chlorine ($Cl_2$) dry etching process is used to remove the exposed portion of the piezoelectric layer 111.

FIG. 1R shows the contacts 119 after being formed by know methods such as a lift-off method using barrier layers of TiW combined with gold (Au) as the material for the contacts 119.

FIG. 1S shows the resultant structure after removal of the sacrificial layer 105 from the cavity 103 in the substrate 101. An etchant is used for the selective removal of the sacrificial layer 105 from the cavity 103. In a representative embodiment where PSG is provided as the sacrificial layer 105, a solution of HF may be used as the etchant. Notably, HF and similar etchants may, in addition to their desired etching capabilities, erode other materials of the structure, or contaminate materials of the structure, or both. Thus, in addition to its intended function, the etchant used to remove the sacrificial layer may adversely impact the predictable acoustic properties of the acoustic resonator by unpredictable and non-uniform etching of other layers of the acoustic stack susceptible to etching by the HF etchant. However, and beneficially, the forming of first passivation layer 107 comprising SiC and the second passivation layer 113 comprising SiC on opposing sides of the first electrode layer 108 and the second electrode layer 112 provides protection of the layers of the acoustic resonator between the first passivation layer 107 and the second passivation layer 113.

The resistance to HF attack by SiC provides greater process margin to fully remove substantially all of the sacrificial layer 105 without risk of attack to other layers of the acoustic resonator of the representative embodiments. As noted above, in a representative embodiment, the annealing of SiC films formed by PECVD is effected at temperatures above approximately 450° C., in order to reduce C—H and Si—H bond species and to provide a coincident increase in Si—C bonding in the SiC layers of the representative embodiments. Alternatively, rapid thermal annealing to 600° C. for approximately 10 minutes may be used to effectively in decrease the hydrogen content of PECVD SiC films and thus reduces contaminants in the resultant SiC. Beneficially, therefore, in accordance with a representative embodiment, after the removal of the sacrificial PSG layer by HF etching, acoustic resonators of representative embodiments comprising PECVD SiC passivation layers can be annealed to improve the acoustic properties of the SiC passivation material. Beneficially, annealing the PECVD SiC after the removal of the PSG layer by HF etching prevents any densification PSG material that might reduce its etch-ability in HF and lead to longer processing times.

Figure 2:
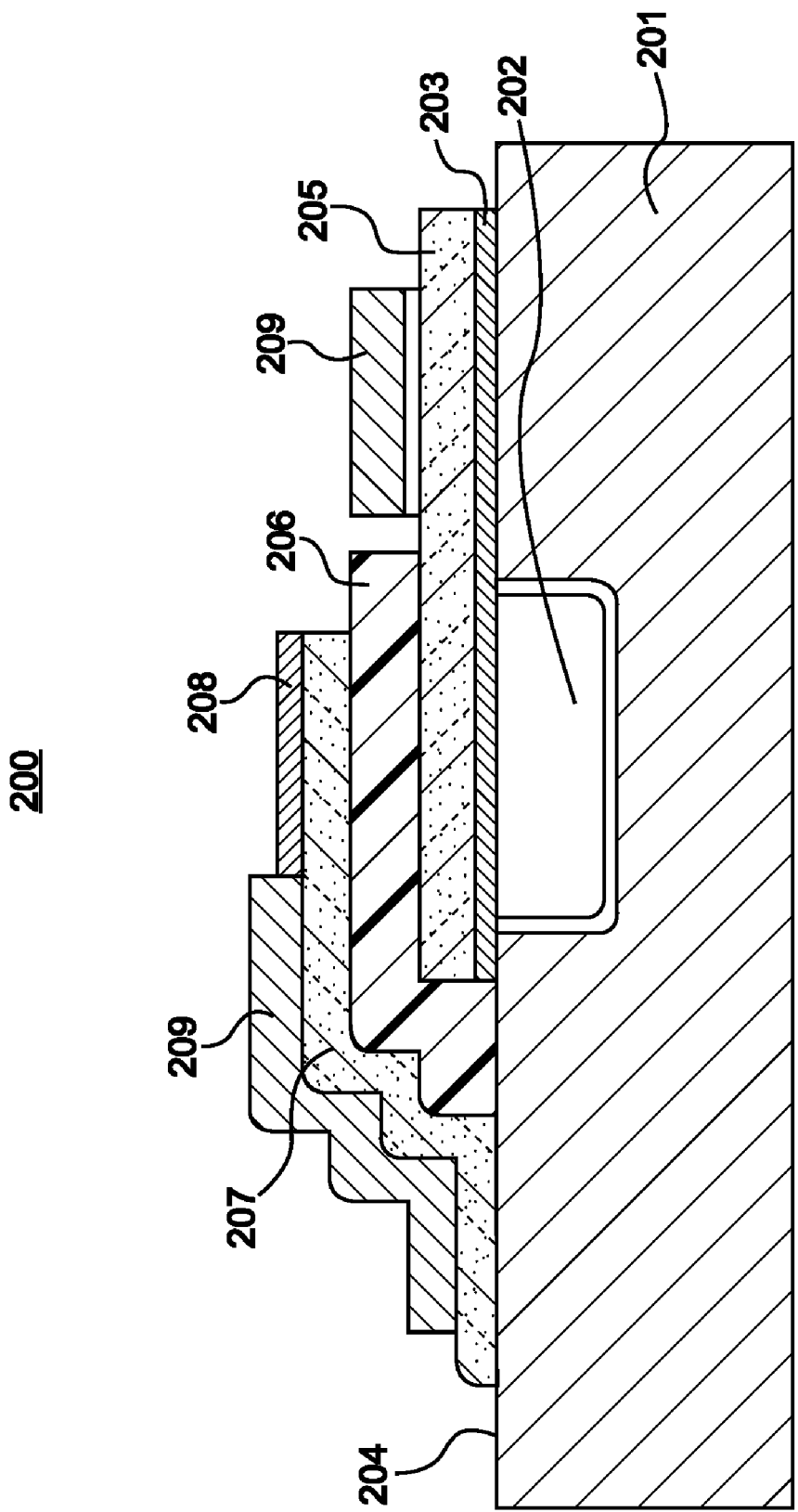
FIG. 2 is a cross-sectional view illustrating an acoustic resonator in accordance with a representative embodiment.

FIG. 2 shows an acoustic resonator 200 in accordance with a representative embodiment. The acoustic resonator 200 may be fabricated in accordance with the illustrative fabrication sequence described in connection with representative embodiments described in connection FIGS. 1A-1S above. The materials used in the fabrication of the acoustic resonator 200 are common to the illustrative fabrication sequence of FIGS. 1A-1S.

The acoustic resonator 200 comprises a substrate 201. A cavity 202 is provided in the substrate 201, and a first passivation layer 203 is provided over an upper surface 204 of the substrate 201. The first passivation layer 203 extends over the cavity 202 and a first electrode 205 is provided over the first passivation layer 203. Like first passivation layer 107, the first passivation layer 203 comprises a layer of SiC as the outermost layer disposed adjacent to the upper surface 204 of the substrate and exposed to the cavity 202. Similar to the first passivation layer 107 described above, the first passivation layer 203 may comprise one or more layers and provides protection of the overlying layers of the acoustic resonator 200 during fabrication and operation thereof. A piezoelectric layer 206 is provided over the first electrode 205, and a second electrode 207 is provided over the piezoelectric layer 206. A second passivation layer 208 is provided over the second electrode 207, and contacts 209 are provided to allow electrical connections to be made to the first and second electrodes 205, 207. Like the second passivation layer 113 described above, the second passivation layer 208 comprises a layer of SiC as the outermost layer of the acoustic resonator 200. The second passivation layer 208 may comprise one or more layers and provides protection of the underlying layers of the acoustic resonator 200 during fabrication and operation thereof.

The active region of the acoustic resonator 200 comprises the region of the acoustic resonator 200 suspended over the cavity 202. As such, the first passivation layer 203 and the second passivation layer 208 are arranged so that the respective silicon carbide layers of the first and second passivation layers 203, 208 are opposing surfaces of the active region of the acoustic resonator 200. The positioning of the SiC layers of the first and second passivation layers 203, 208 as the outermost layers of the active region of the acoustic resonator 200 provides protection from the ambient beneath (i.e., the cavity) the active region, and the ambient above the active region. Moreover, during fabrication, the active region of the acoustic resonator 200 is protected by the location of the SiC layers as the outmost layers of the active region.

Figure 3:
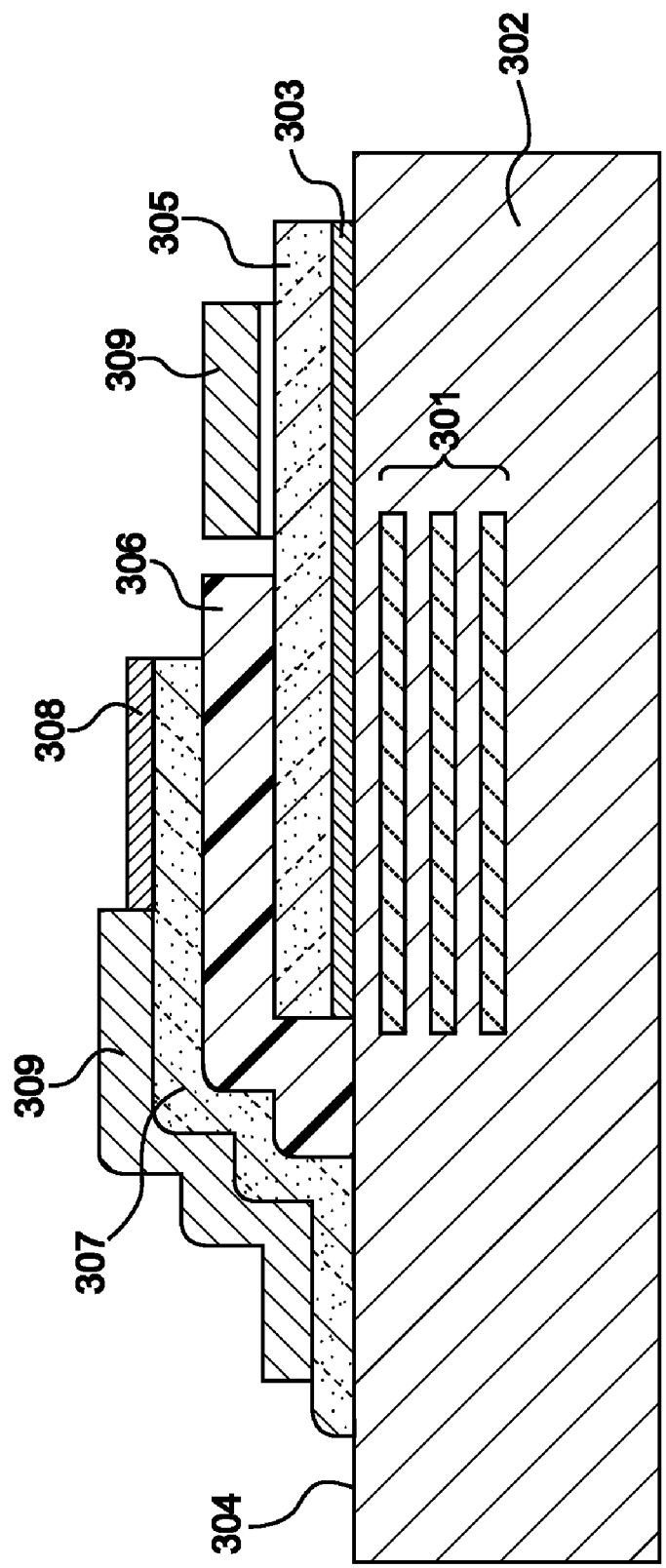
FIG. 3 is a cross-sectional view illustrating an acoustic resonator in accordance with a representative embodiment.

FIG. 3 shows an acoustic resonator 300 in accordance with a representative embodiment. The acoustic resonator 300 may be fabricated in accordance with the illustrative fabrication sequence described in connection with representative embodiments described in connection FIGS. 1A-1S above. The materials used in the fabrication of the acoustic resonator 300 are common to the illustrative fabrication sequence of FIGS. 1A-1S. Moreover, many of the details of the acoustic resonator 200 are common to the acoustic resonator 300 and are not repeated in order to avoid obscuring the details of the representative embodiment describe presently.

The acoustic resonator 300 comprises a substrate 302. An acoustic mirror 301 is provided in the substrate. Acoustic mirrors, such as Bragg mirrors are known and are provided to improve the performance and Q factor of the acoustic resonator 300. Illustratively, the acoustic mirror 301 comprises alternating layers of high acoustic impedance and low acoustic impedance. The acoustic mirror 301 may be as described for example in one of more of the following U.S. Pat. Nos. 6,542,054 to Aigner, et al.; 5,872,493 to Ella; 5,873,154 to Ylilammi, et al.; and 7,669,310 to Fattinger. The disclosures of these patents and patent publication are specifically incorporated herein by reference.

An optional first passivation layer 303 is provided over an upper surface 304 of the substrate 302. Unlike the embodiments described previously, because an acoustic mirror 301 and not a cavity (e.g., cavities 103, 202) is provided in the acoustic resonator 300, exposure to the ambient on one side of the acoustic resonator 300 is eliminated. Accordingly, the optional first passivation layer 303 does not necessarily comprise a layer of SiC disposed adjacent to the upper surface 304 of the substrate. Rather, if provided, the optional first passivation layer 303 comprises AlN such as described in U.S. Pat. No. 7,275,292 to Ruby, et al. A piezoelectric layer 306 is provided over the first electrode 305, and a second electrode 307 is provided over the piezoelectric layer 306. A second passivation layer 308 is provided over the second electrode 307, and contacts 309 are provided to provide electrical connections to the first and second electrodes 305, 307. As described above, the second passivation layer 308 comprises a layer of SiC as the uppermost layer of the acoustic resonator 300. Thus, the acoustic resonator comprises a layer of SiC as opposing surfaces thereof.

The active region of the acoustic resonator 300 comprises the region of the acoustic resonator 300 disposed over the acoustic mirror 301. As such, the second passivation layer 308 is arranged so that the SiC layer of the second passivation layers 308 is the uppermost layer of the active region of the acoustic resonator. The positioning of the SiC layer of the second passivation layers 308 as the uppermost layer of the active region of the acoustic resonator 300 provides protection from the ambient to the active region on the upper side of the acoustic resonator 300; and the substrate 302 provides protection from the ambient on the lower side of the acoustic resonator 300.

Figure 4:
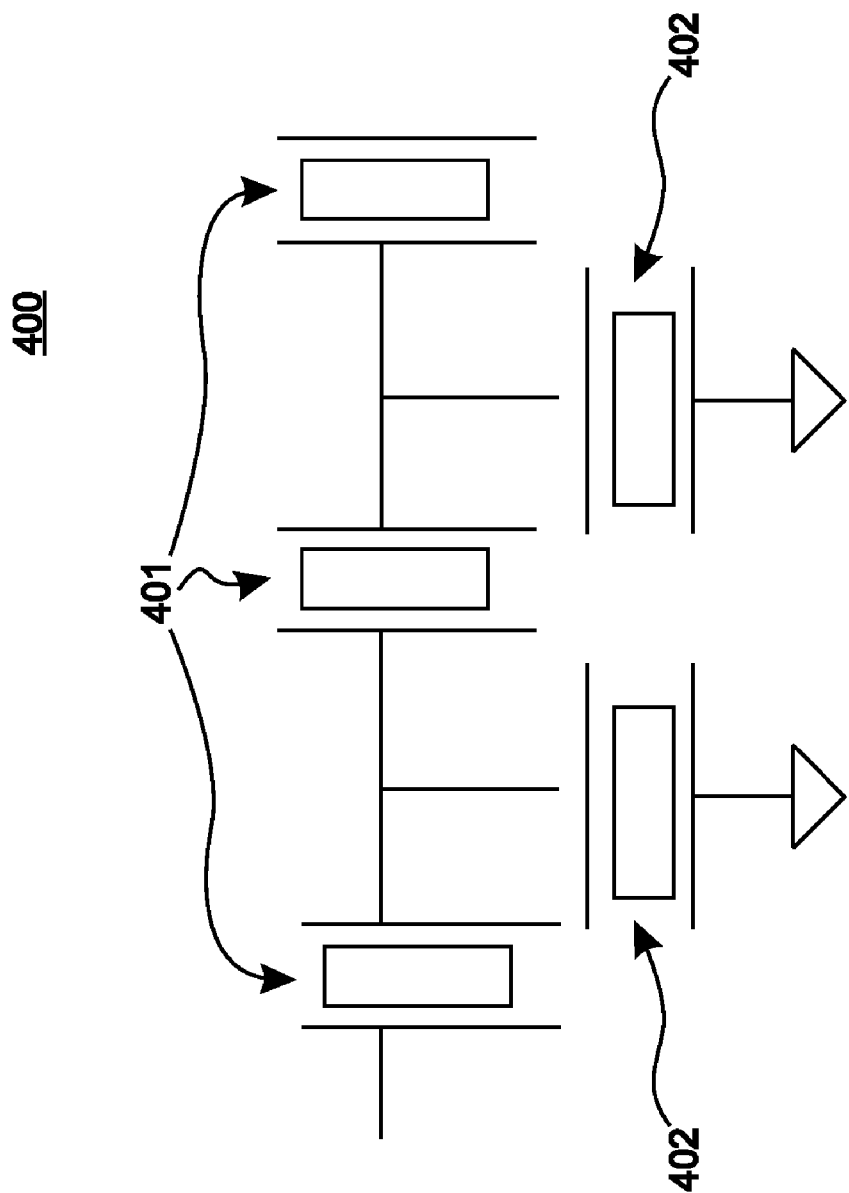
FIG. 4 is a simplified schematic block diagram of an electrical filter in accordance with a representative embodiment.

When connected in a selected topology, a plurality of acoustic resonators 200, 300 can function as an electrical filter. FIG. 4 is a simplified schematic block diagram of an electrical filter 400 in accordance with a representative embodiment. The electrical filter 400 comprises series acoustic resonators 401 and shunt acoustic resonators 402. The series acoustic resonators 401 and shunt acoustic resonators 402 may comprise the acoustic resonators 200, 300 described in connection with the representative embodiments of FIGS. 2 and 3, and fabricated in accordance with the representative embodiments described in connection with FIGS. 1A-1S. The electrical filter 400 is commonly referred to as a ladder filter, and may be used for example in duplexer applications. Further details of a ladder-filter arrangement may be as described for example in U.S. Pat. No. 5,910,756 to Ella, and U.S. Pat. No. 6,262,637 to Bradley, et al. The disclosures of these patents are specifically incorporated by reference. It is emphasized that the topology of the electrical filter 400 is merely illustrative and other topologies are contemplated. Moreover, the acoustic resonators of the representative embodiments are contemplated in a variety of applications besides duplexers.

Figure 5:
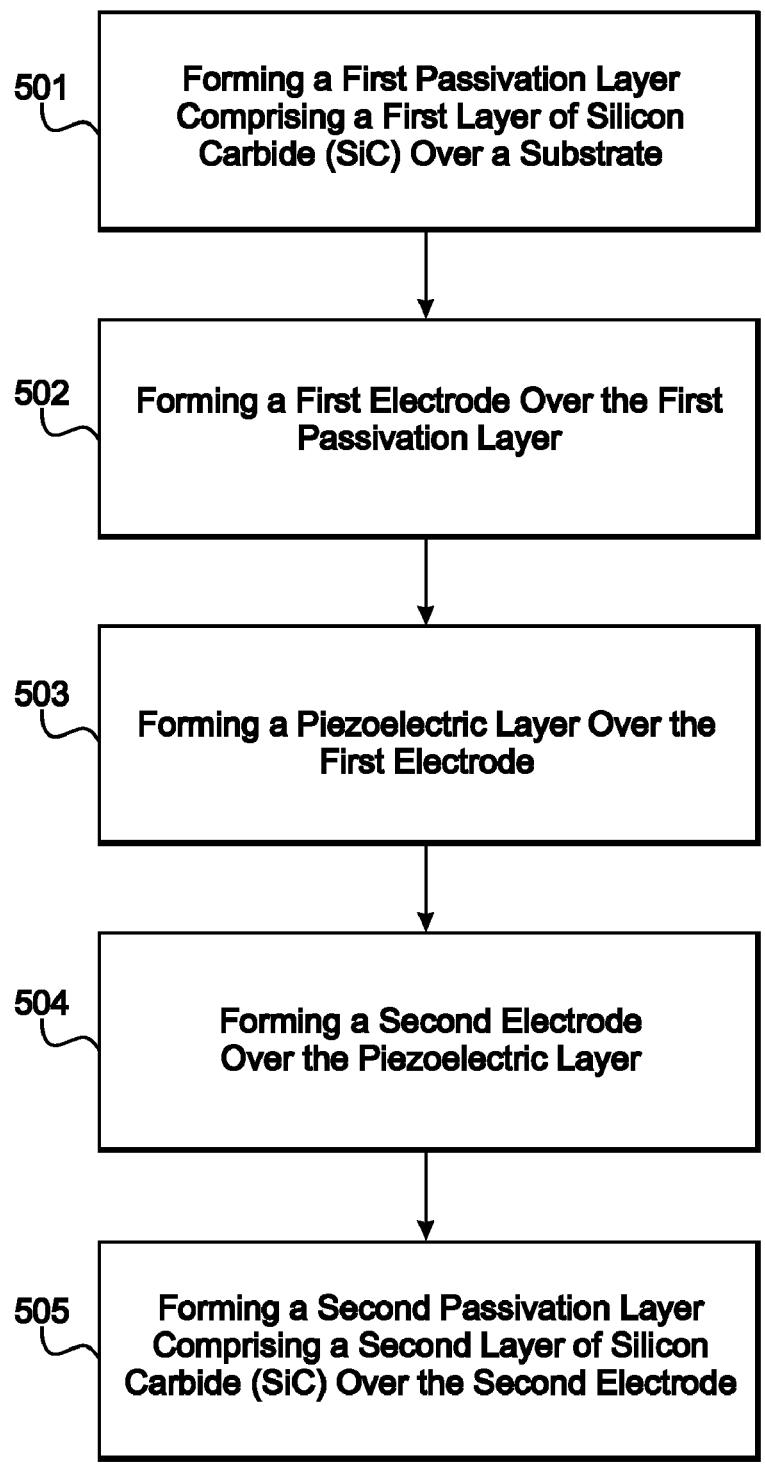
FIG. 5 is a flow-chart of a method of fabricating an acoustic resonator in accordance with a representative embodiment.

FIG. 5 is a flow-chart of a method 500 of fabricating an acoustic resonator in accordance with a representative embodiment. Many of the details of the materials and processes of the method 500 are common to those described above in connection with FIGS. 1A-3. At 501, the method 500 comprises forming a first passivation layer (e.g., first passivation layers 107, 203, 303) comprising a first layer of silicon carbide (SiC) over a substrate. At 502, the method comprises forming a first electrode over the first passivation layer. At 503, the method comprises forming a piezoelectric layer over the first electrode. At 504, the method comprises forming a second electrode (e.g., 112, 207,307) over the piezoelectric layer. At 505, the method comprises forming a second passivation layer (e.g., 113, 208, 308) comprising a second layer of silicon carbide (SiC) over the second electrode.

In accordance with illustrative embodiments, acoustic resonators for various applications such as in electrical filters having a passivation layer comprising a layer of SiC. One of ordinary skill in the art appreciates that many variations that are in accordance with the present teachings are possible and remain within the scope of the appended claims. These and other variations would become clear to one of ordinary skill in the art after inspection of the specification, drawings and claims herein. The invention therefore is not to be restricted except within the spirit and scope of the appended claims.

The invention claimed is:

1. An acoustic resonator, comprising:
 a substrate;
 a first passivation layer disposed over the substrate, the first passivation layer comprising a first layer of silicon carbide (SiC), and a layer of aluminum nitride (AlN) disposed between the first layer of SiC and a first electrode, wherein the first electrode is disposed over the first passivation layer;
 a second electrode;
 a piezoelectric layer disposed between the first and second electrodes; and
 a second passivation layer disposed over the second electrode, the second passivation layer comprising a second layer of silicon carbide (SiC).

2. An acoustic resonator as claimed in claim 1, wherein the first passivation layer is disposed over air and beneath the first electrode.

3. An acoustic resonator as claimed in claim 2, wherein the second passivation layer further comprises a layer of aluminum nitride (AlN) disposed between the second layer of SiC and the second electrode.

4. An acoustic resonator as claimed in claim 3, wherein the layer of AlN of the second passivation layer comprises a first thickness and the second layer of SiC comprises a second thickness.

5. An acoustic resonator as claimed in claim 1, wherein the first passivation layer is disposed over an acoustic mirror and beneath the first electrode.

6. An electrical filter, comprising:
 an acoustic resonator, the acoustic resonator comprising:
 a substrate;
 a first passivation layer disposed over the substrate, the first passivation layer comprising a first layer of silicon carbide (SiC), and a first layer of aluminum nitride (AlN) disposed between the first layer of SiC and the first electrode, wherein the first electrode is disposed over the first passivation layer;
 a second electrode;
 a piezoelectric layer disposed between the first and second electrodes; and
 a second passivation layer disposed over the second electrode, the second passivation layer comprising a second layer of silicon carbide (SiC).

7. An electrical filter as claimed in claim 6, wherein the first passivation layer is disposed over an acoustic mirror and beneath the first electrode.

8. An electrical filter as claimed in claim 6, wherein the first passivation layer is disposed over air and beneath the first electrode.

9. An electrical filter as claimed in claim 8, wherein the second passivation layer further comprises a second layer of aluminum nitride (AlN) disposed between the second layer of SiC and the second electrode.

10. An electrical filter as claimed in claim 9, wherein the second layer of AlN comprises a first thickness and the second layer of SiC comprises a second thickness, and the first thickness is greater than the second thickness.

11. An electrical filter as claimed in claim 6, wherein the first layer of AlN comprises a first thickness and the first layer of SiC comprises a second thickness.

12. A method of fabricating an acoustic resonator, the method comprising:
 forming a first passivation layer comprising forming a first layer of silicon carbide (SiC) over a substrate, and forming a first layer of aluminum nitride over the first layer of SiC;
 forming a first electrode over the first passivation layer;
 forming a piezoelectric layer over the first electrode;
 forming a second electrode over the piezoelectric layer;
 forming a second passivation layer comprising a second layer of silicon carbide (SiC) over the second electrode.

13. A method as claimed in claim 12, further comprising, after forming the second passivation layer, removing a sacrificial layer to reveal a cavity in the substrate beneath the first passivation layer.

14. A method as claimed in claim 12, wherein the forming of the second passivation layer further comprises forming a second layer of aluminum nitride between the second electrode and the second layer of SiC.

15. A method as claimed in claim 12, wherein the forming the first passivation layer, or the second passivation layer, or both, further comprises sputtering depositing the SiC.

16. A method as claimed in claim 12, wherein the forming the first passivation layer, or the second passivation layer, or both, further comprises plasma enhanced chemical vapor depositing (PECVD) the SiC.

* * * * *